(12) United States Patent
Duan et al.

(10) Patent No.: US 11,362,295 B2
(45) Date of Patent: Jun. 14, 2022

(54) ORGANIC ELECTROLUMINESCENT DEVICE

(71) Applicants:KUNSHAN GO-VISIONOX OPTO-ELECTRONICS CO., LTD., Kunshan (CN); TSINGHUA UNIVERSITY, Beijing (CN)

(72) Inventors: Lian Duan, Beijing (CN); Dongdong Zhang, Beijing (CN); Xiaozeng Song, Beijing (CN); Minghan Cai, Beijing (CN); Jinbei Wei, Kunshan (CN)

(73) Assignees: KUNSHAN GO-VISIONOX OPTO-ELECTRONICS CO., LTD., Kunshan (CN); TSINGHUA UNIVERSITY, Beijing (CN)

( * ) Notice: Subject to any disclaimer, the term of this patent is extended or adjusted under 35 U.S.C. 154(b) by 458 days.

(21) Appl. No.: 16/552,319

(22) Filed: Aug. 27, 2019

(65) Prior Publication Data

US 2019/0386235 A1 Dec. 19, 2019

Related U.S. Application Data

(63) Continuation of application No. PCT/CN2018/089279, filed on May 31, 2018.

(30) Foreign Application Priority Data

Nov. 18, 2017 (CN) .......................... 201711151474.6

(51) Int. Cl.
*H01L 51/50* (2006.01)
*H01L 51/00* (2006.01)

(52) U.S. Cl.
CPC ...... *H01L 51/5012* (2013.01); *H01L 51/5004* (2013.01); *H01L 51/5056* (2013.01); *H01L 51/006* (2013.01); *H01L 51/007* (2013.01); *H01L 51/0052* (2013.01); *H01L 51/0054* (2013.01); *H01L 51/0055* (2013.01); *H01L 51/0056* (2013.01); *H01L 51/0059* (2013.01);
(Continued)

(58) Field of Classification Search
CPC ....................................................... H01L 51/50
See application file for complete search history.

(56) References Cited

U.S. PATENT DOCUMENTS

2015/0001502 A1* 1/2015 Seo ...................... H01L 51/5206
257/40
2018/0375053 A1* 12/2018 Duan .................. H01L 51/5004

FOREIGN PATENT DOCUMENTS

| CN | 104247076 A | 12/2014 |
| CN | 105503766 A | 4/2016 |

(Continued)

OTHER PUBLICATIONS

International Search Report dated Sep. 6, 2018 in corresponding International application No. PCT/CN2018/089279; 5 pages.
(Continued)

*Primary Examiner* — Vu A Nguyen
(74) *Attorney, Agent, or Firm* — Maier & Maier, PLLC

(57) ABSTRACT

The present disclosure relates to the technical field of display, and specifically relates to an organic electroluminescent device, and in particular, to a highly efficient fluorescence device. An organic electroluminescent device includes a hole transport layer, and a light-emitting layer. The hole transport layer and the light-emitting layer has an interface exciplex formed at an interface therebetween.

16 Claims, 2 Drawing Sheets

(52) U.S. Cl.
CPC ...... *H01L 51/0061* (2013.01); *H01L 51/0067* (2013.01); *H01L 51/0069* (2013.01); *H01L 51/0071* (2013.01); *H01L 51/0072* (2013.01); *H01L 51/0077* (2013.01); *H01L 51/0092* (2013.01); *H01L 2251/552* (2013.01)

(56) References Cited

FOREIGN PATENT DOCUMENTS

| | | |
|---|---|---|
| CN | 105895811 A | 8/2016 |
| CN | 106328816 A | 1/2017 |
| JP | 2014220450 A | 11/2014 |
| JP | 2015170793 A | 9/2015 |
| TW | 201623574 A | 7/2016 |
| TW | 201712922 A | 4/2017 |
| TW | 201722977 A | 7/2017 |

OTHER PUBLICATIONS

Taiwanese Office Action dated May 22, 2019 in corresponding application No. 107119352; 4 pages.

* cited by examiner

ORGANIC ELECTROLUMINESCENT DEVICE

CROSS-REFERENCE TO RELATED APPLICATION

The disclosure claims the benefit of priority of Chinese Patent Application No. 201711151474.6, filed on Nov. 18, 2017, and the entire disclosures of which are incorporated herein.

TECHNICAL FIELD

The present disclosure relates to the field of display technologies, and particularly, to an organic electroluminescent device.

BACKGROUND

Organic Light-Emitting Diodes (OLEDs) have a great application prospect in the field of display and illumination and are increasingly concerned by people due to the advantages of ultra-thin, light weight, low energy consumption, active illumination, wide viewing angle, and fast response.

In 1987, Deng Qingyun (C. W. Tang) and Vanslyke of the U.S.A. Eastman Kodak Company, first reported a two-layer organic electroluminescent device prepared by using a transparent conductive film as an anode, $Alq_3$ as a light-emitting layer, triarylamine as a hole transport layer, and an Mg/Ag alloy as a cathode. The conventional fluorescent materials are easy to synthesize and stable, and the device has a long lifetime. However, due to the electron spin inhibition, at most 25% of singlet excitons can be used for luminescence, and 75% of triplet excitons are wasted. The external quantum efficiency of the device is often less than 5% that needs to be further improved.

In order to improve the utilization of excitons, it is proposed to introduce heavy metal atoms into molecules, which allows to realize the spin-orbit coupling of the singlet state and the triplet state through the heavy atom effect, so as to use 75% of triplet excitons to achieve 100% internal quantum efficiency. However, the higher material cost due to the heavy metal atoms limits the further development of the material.

A fluorescent OLED device capable of breaking the limitation of 25% of the internal quantum efficiency mainly employs a Thermally Activated Delayed Fluorescence (TADF) mechanism. The TADF mechanism utilizes an organic small molecular material having a small singlet-triplet energy level gap ($\Delta E_{ST}$). The triplet excitons of the organic small molecular material having a small singlet-triplet energy level gap can be converted to singlet excitons by the process of Reverse Intersystem Crossing (RISC) under the absorption of ambient heat, which enables to reach 100% of the internal quantum efficiency of the device in theory. However, the problem of low frequency of the fluorescent electroluminescent device still exists.

SUMMARY

Therefore, the present disclosure is to solve the problem of low efficiency of the fluorescent electroluminescent device.

For this purpose, the present disclosure provides an organic electroluminescent device, having a first electrode, a second electrode, and an organic functional layer located between the first electrode and the second electrode, the organic functional layer including a hole transport layer and a light-emitting layer which are arranged in a stacked manner. An interface exciplex is formed at an interface of the hole transport layer and the light-emitting layer.

In the foregoing organic electroluminescent device, the light-emitting layer comprises a sensitized material, a first host material and a fluorescent dye, the sensitized material is a TADF material, and a material of the hole transport layer and the first host material of the light-emitting layer form the interface exciplex.

In the foregoing organic electroluminescent device, a triplet level of the exciplex is less than a triplet level of the material of the hole transport layer, and the triplet level of the exciplex is less than a triplet level of the first host material. The emission spectrum of the exciplex is red-shifted compared to the emission spectrum of the hole transport material and the first host material.

In the foregoing organic electroluminescent device, a singlet level of the exciplex is greater than a singlet level of the TADF material, and the triplet level of the exciplex is greater than a triplet level of the TADF material.

In the foregoing organic electroluminescent device, an energy level difference between the HOMO level of the first host material and the LUMO level of the first host material is greater than 2.5 eV.

In the foregoing organic electroluminescent device, a singlet-triplet energy level gap of the TADF material is less than 0.2 eV.

In the foregoing organic electroluminescent device, the fluorescent dye accounts for 0.1-20% of a mass of the first host material, preferably 0.5-10%. The TADF material accounts for 5-80% of the mass of the first host material, preferably 10-40%.

In the foregoing organic electroluminescent device, the hole transport layer contains a hole transport layer material with a hole transport capacity, and a single layer or a plurality of layers of the hole transport layer material may be provided as needed. The hole transport layer material is a compound having a tertiary aromatic amine or carbazole unit. Preferably, the hole transport layer material employs one of the following structures:

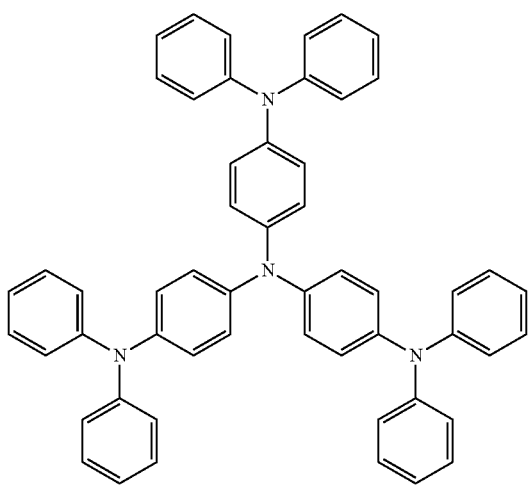

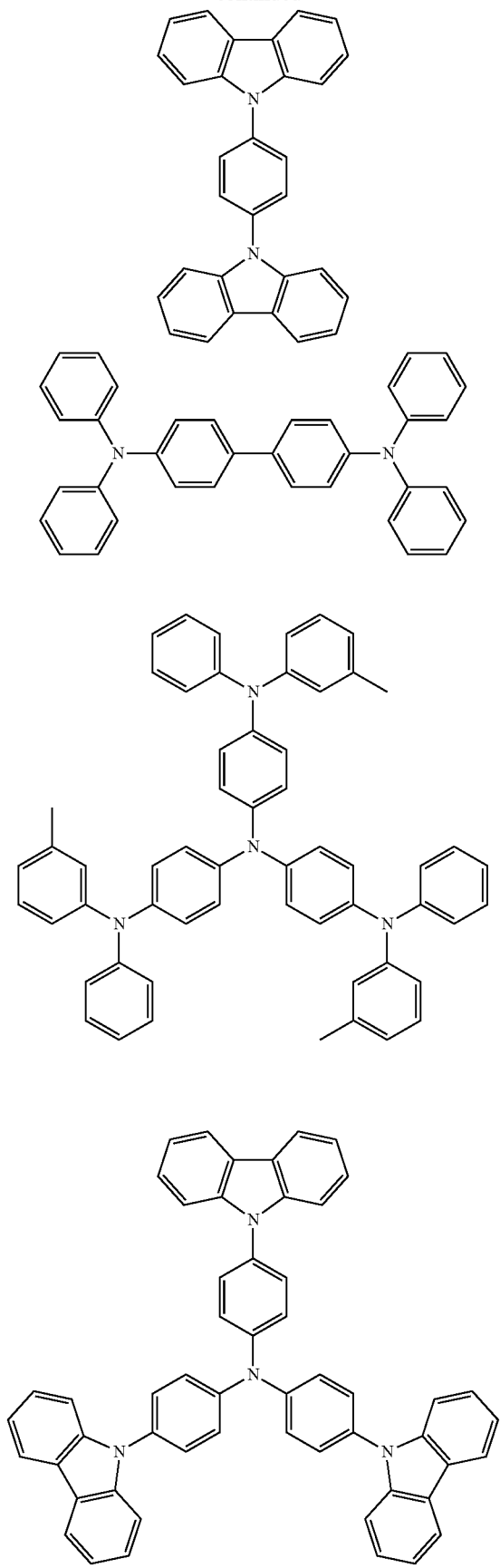
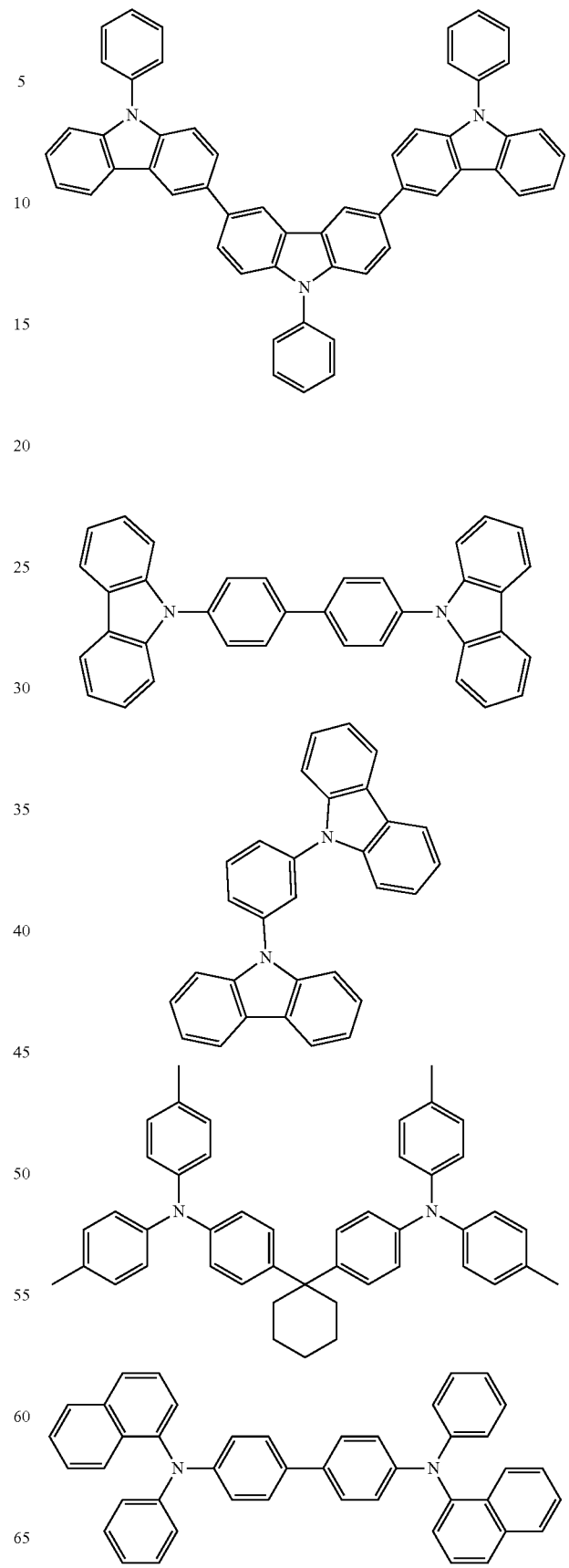

-continued
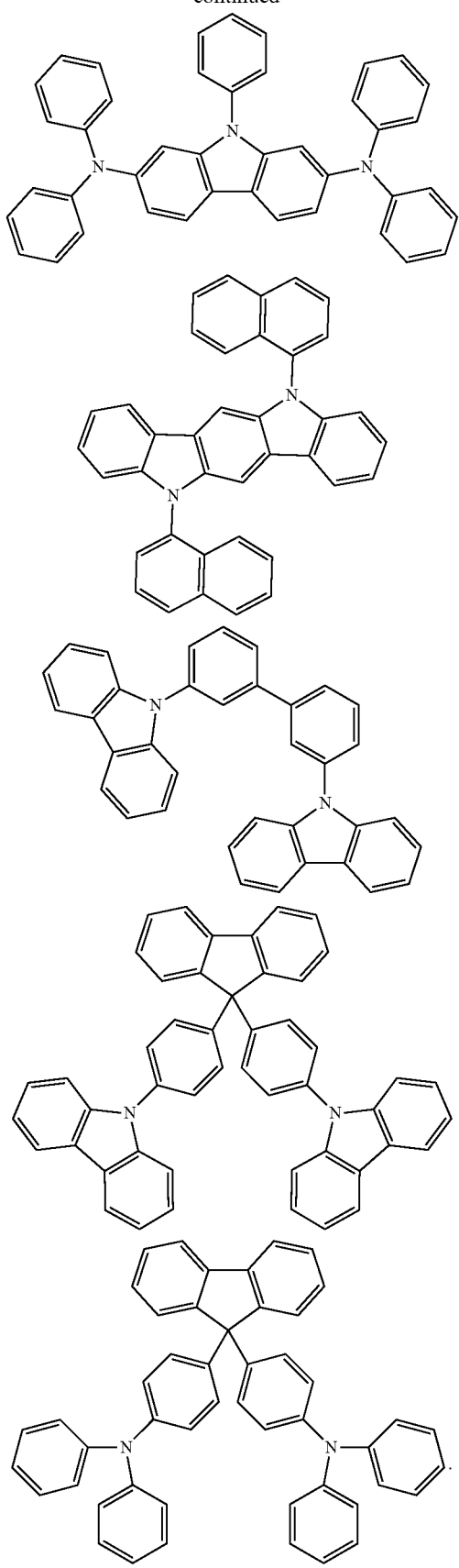
In the foregoing organic electroluminescent device, the first host material contains one or more units of carbonyl, phosphine oxide, pyrimidine, or pyridine. Preferably, the first host material employs any one of the following structures:
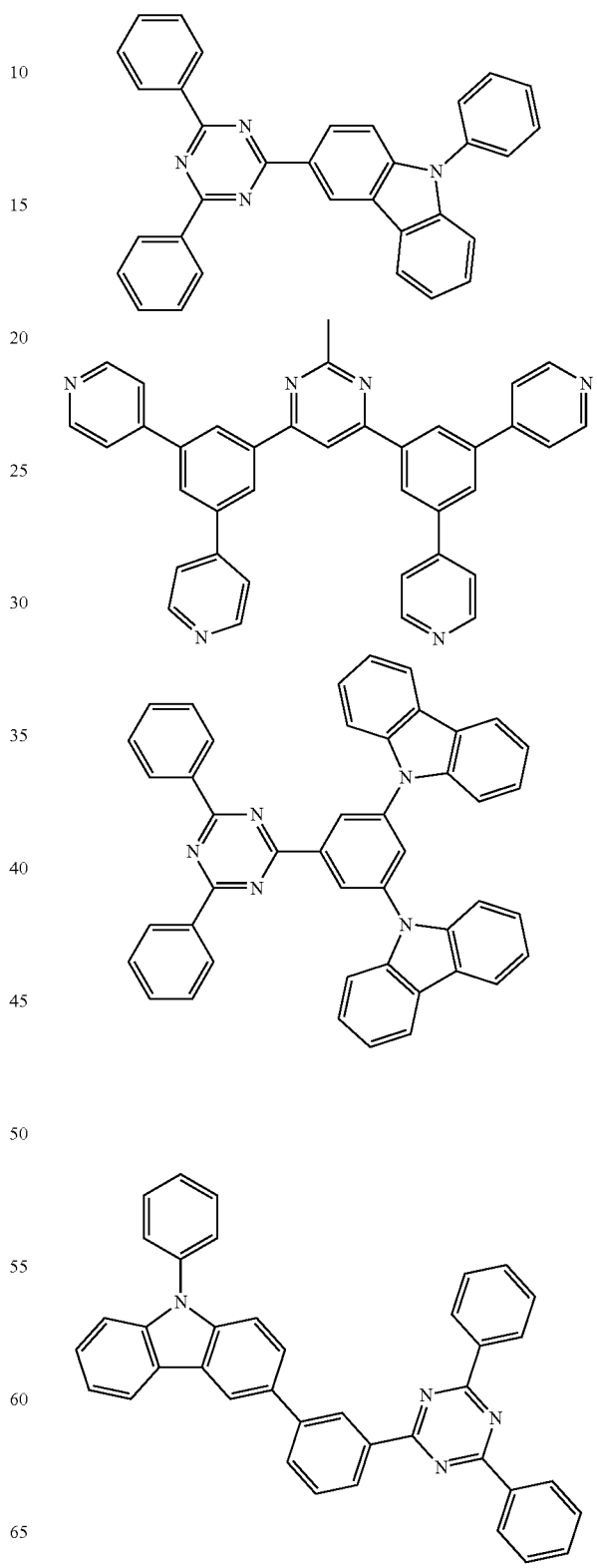

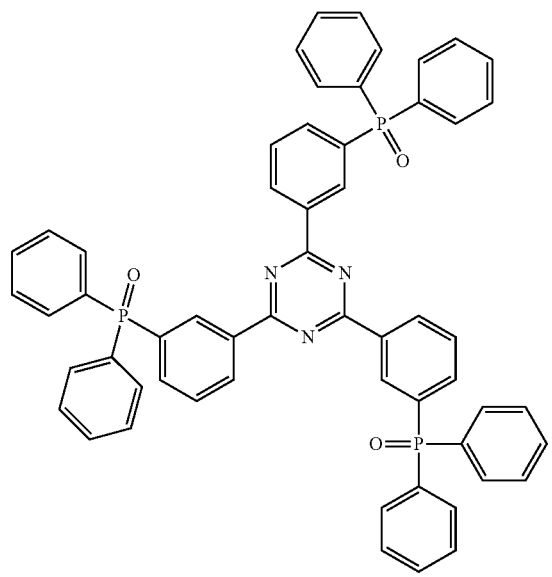
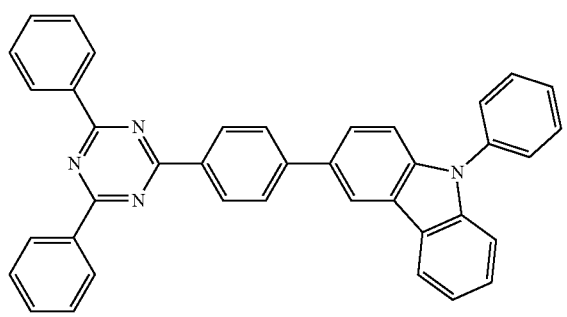
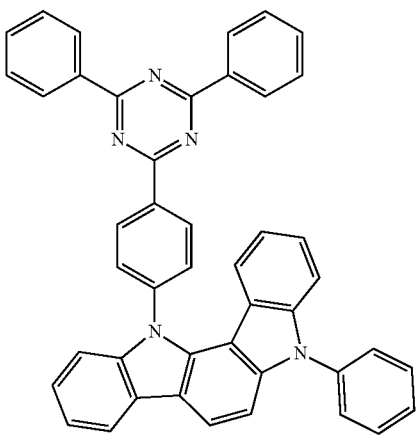
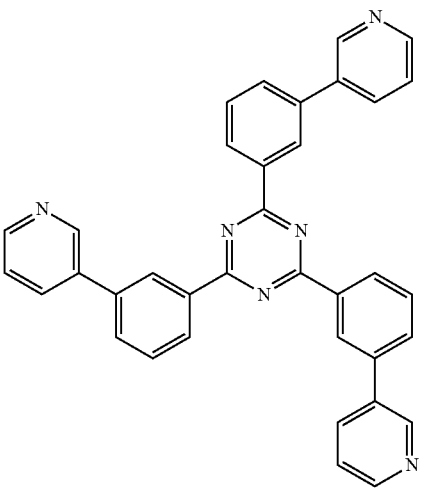
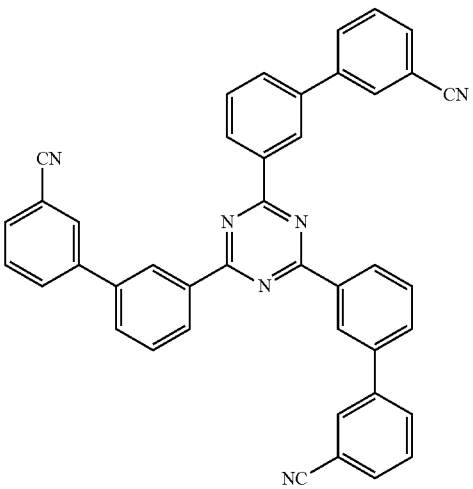
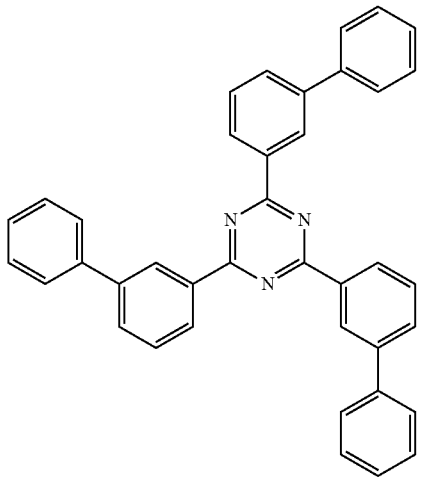

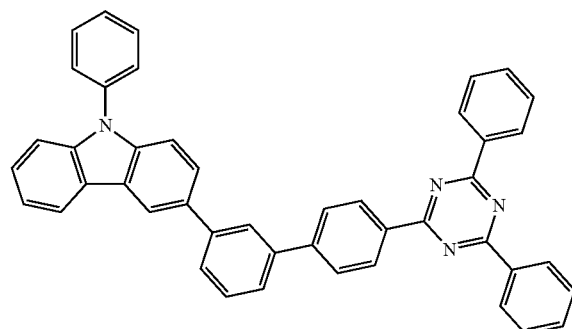
In the foregoing organic electroluminescent device, the TADF material has both a donor unit and a receptor unit. The donor unit is formed by linking one or more donor groups, and the receptor unit is formed by linking one or more receptor groups.
In the foregoing organic electroluminescent device, the donor group is selected from the following groups:
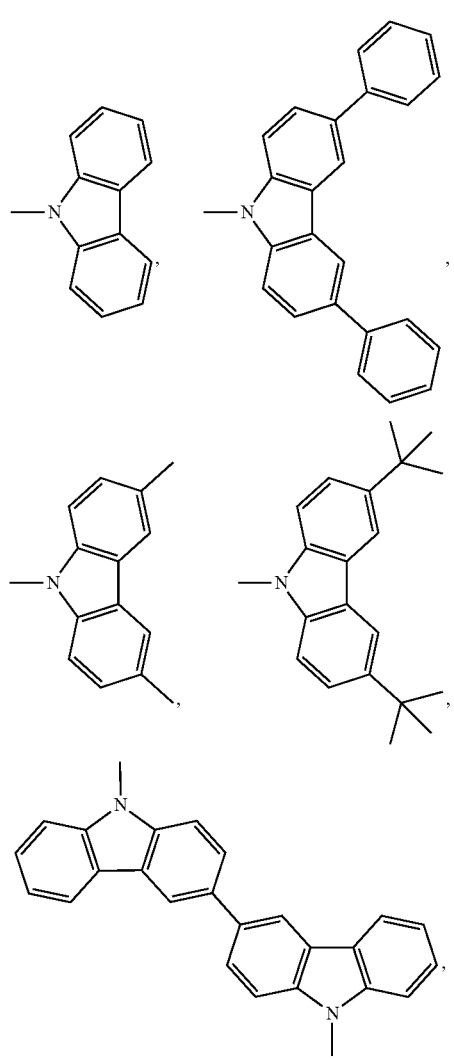
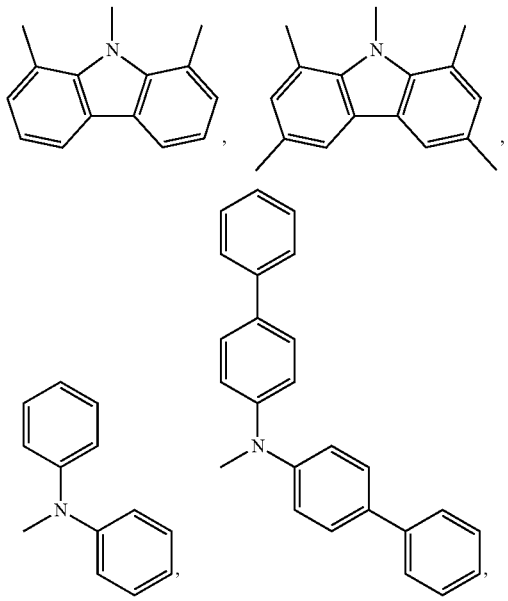

-continued
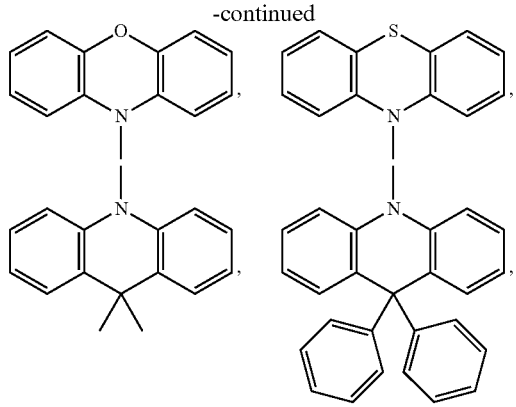
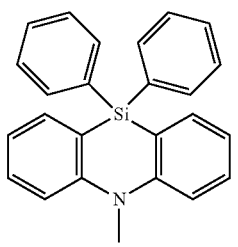
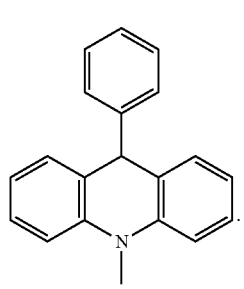
In the foregoing organic electroluminescent device, the receptor group is selected from the following groups:
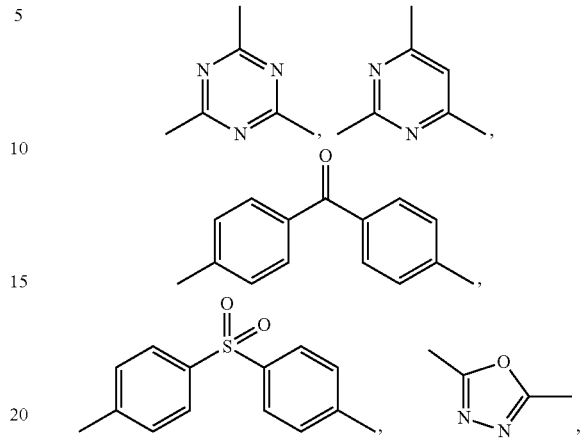
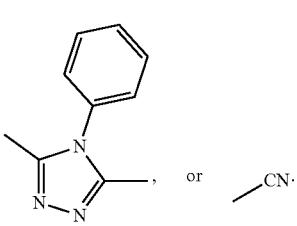
In the foregoing organic electroluminescent device, the TADF material at least comprises one of the following structures:
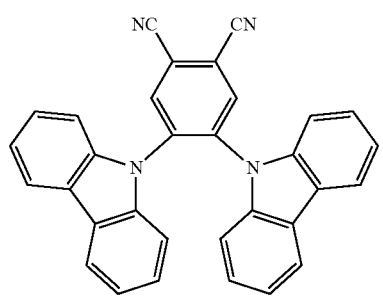
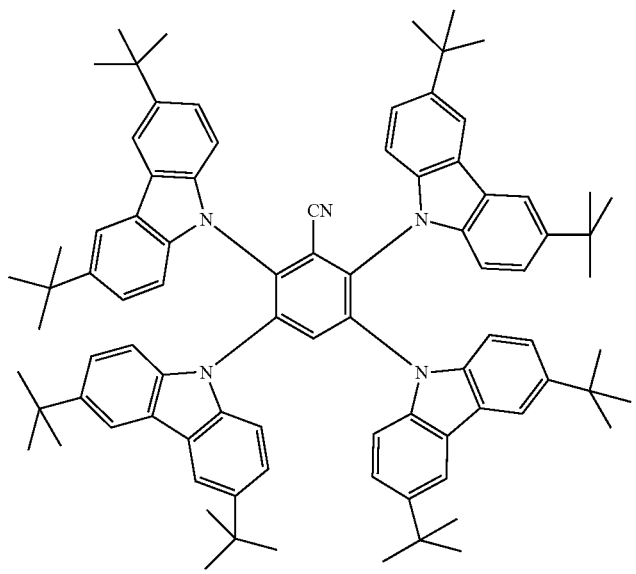

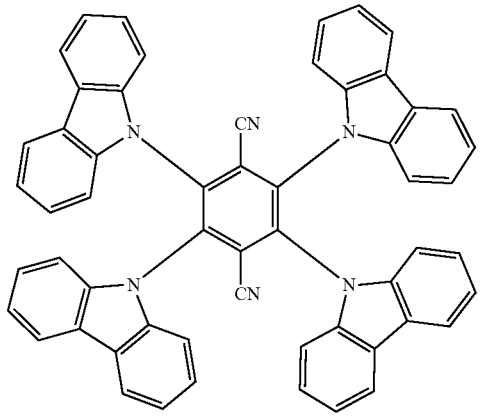
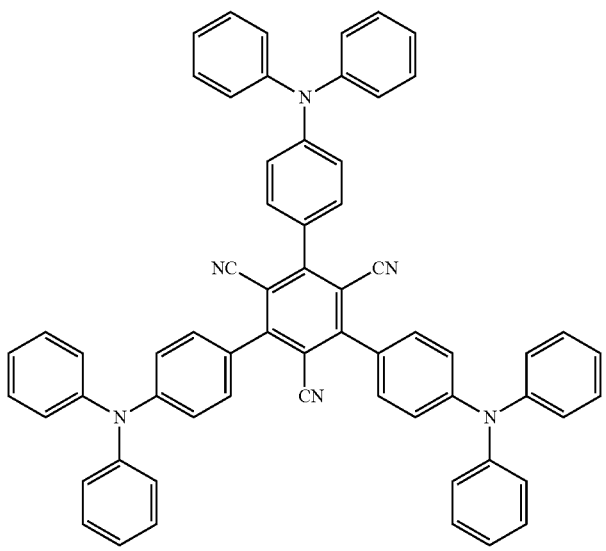
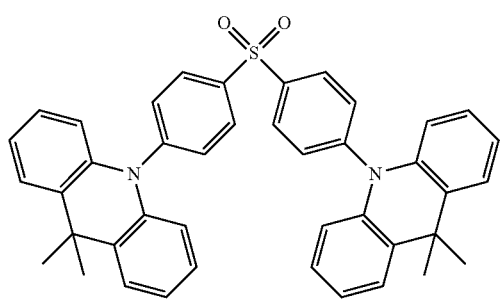
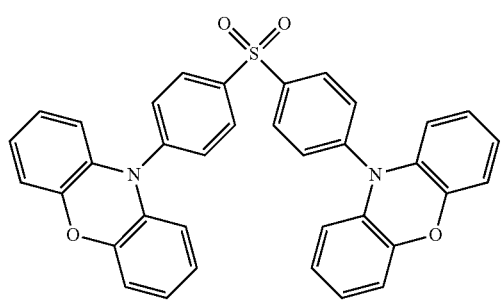
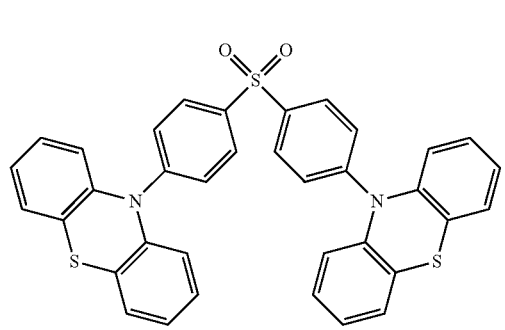
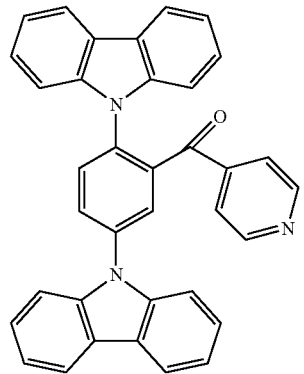
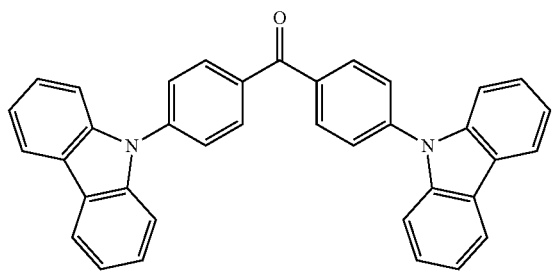

15 16
-continued
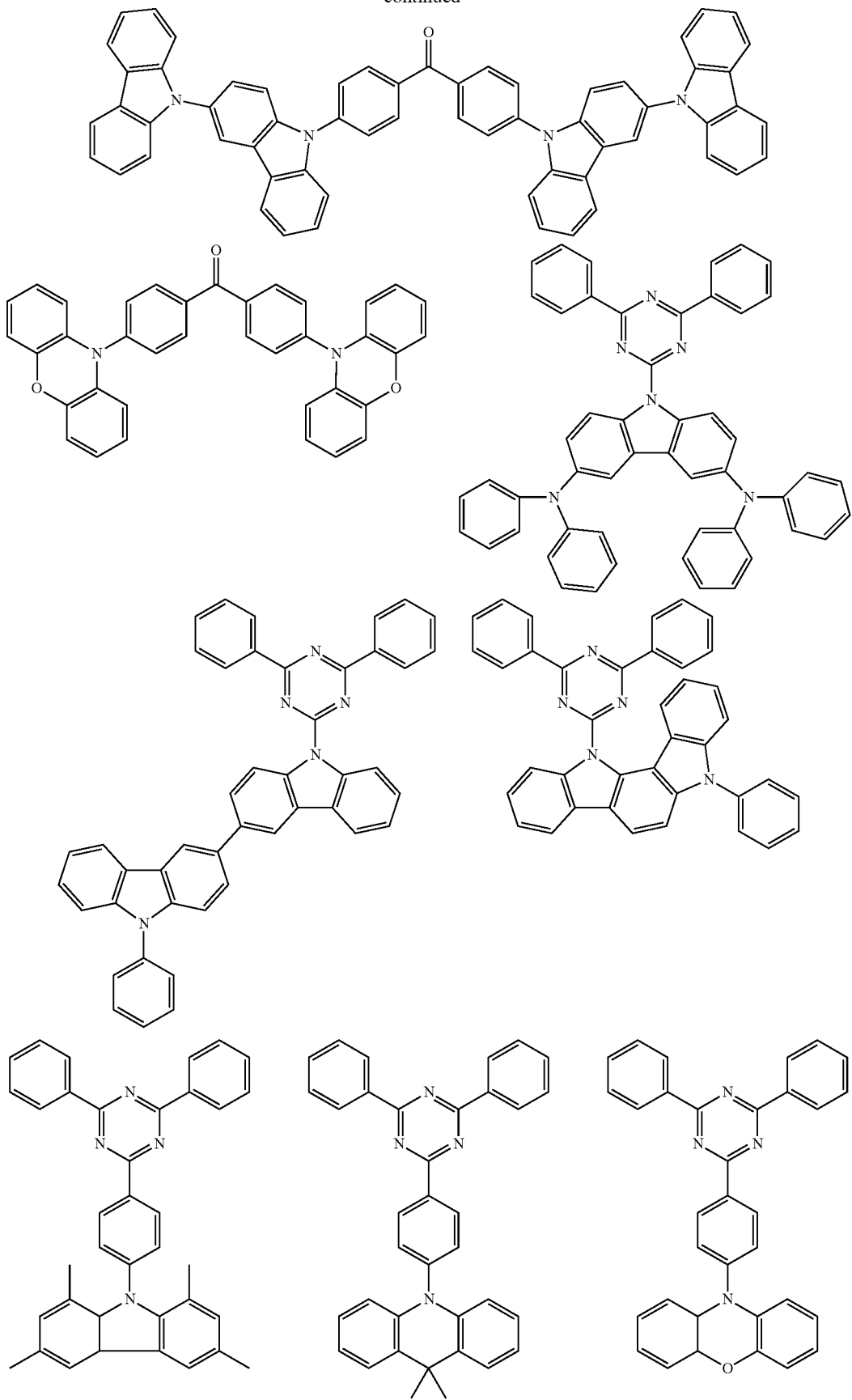

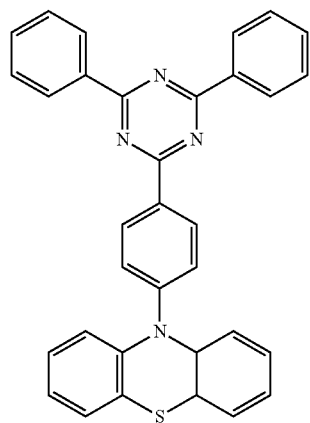
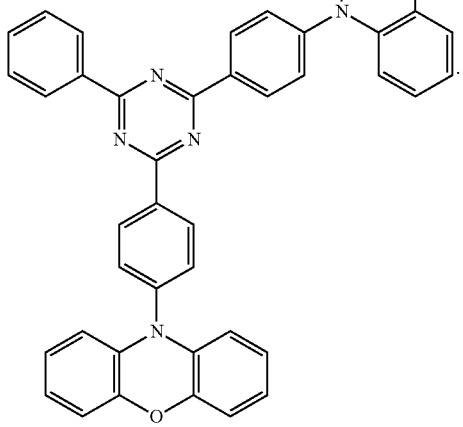
In the foregoing organic electroluminescent device, the fluorescent dye at least includes one of the following structures, which can be selected according to the light color:
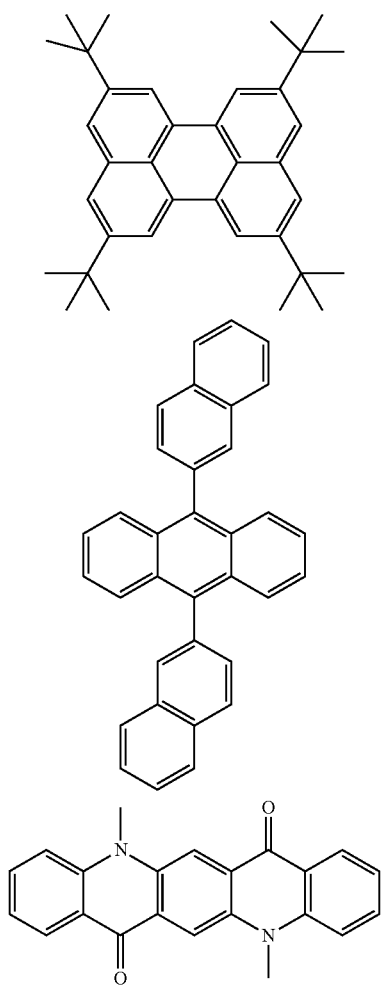
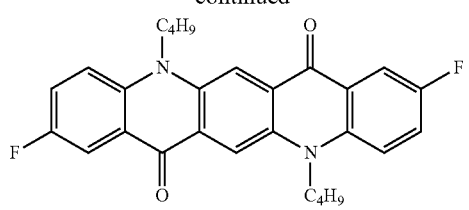
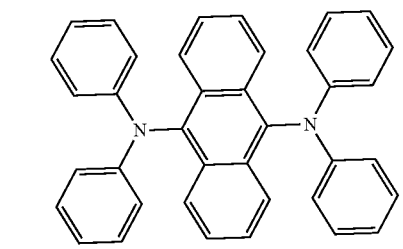
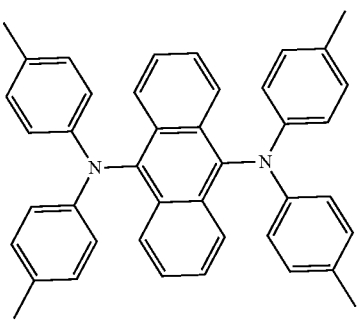

-continued

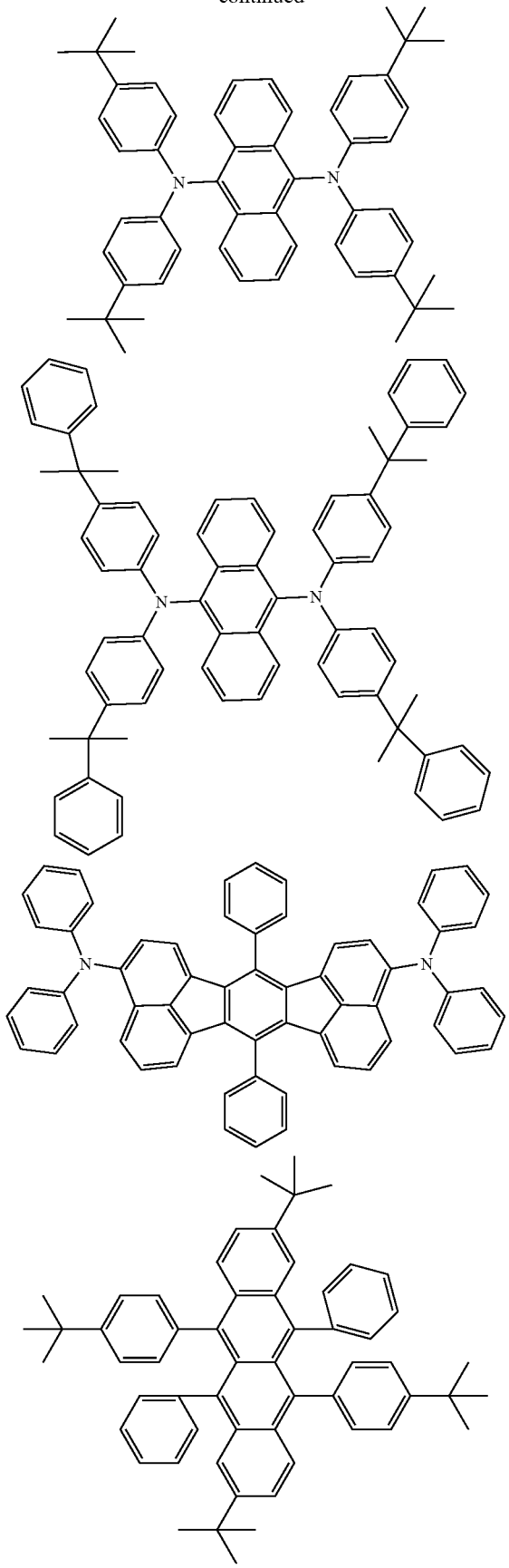

-continued

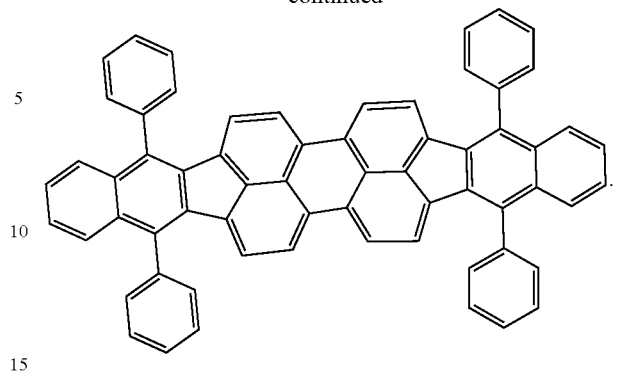

The technical solution of the present disclosure has the following advantages:

1. The organic electroluminescent device provided in the present disclosure has a first electrode, a second electrode, and an organic functional layer located between the first electrode and the second electrode, wherein the organic functional layer comprises a hole transport layer and a light-emitting layer which are arranged in a stacked manner, and the light-emitting layer comprises a sensitized material, a first host material, and a fluorescent dye. A pure organic fluorescent emitter free of noble metal is able to be obtained, an interface exciplex is formed by the hole transport layer material and the first host material in the light-emitting layer, and using the TADF material as a sensitizer further sensitize the fluorescent dye. A TADF-Sensitized Fluorescence (TSF) organic electroluminescent device prepared by the present disclosure has an external quantum efficiency exceeding about 5% of the external quantum efficiency of the conventional fluorescent device, greatly improving the luminous efficiency of the fluorescent OLED device, as well as having the advantages of low turn-on voltage and low roll-off. Finally, The TSF organic electroluminescent device having a high efficiency and low roll-off is able to be obtained.

2. In the organic electroluminescent device provided by the present disclosure, as shown in FIG. 1, the hole transport layer material and the first host material in the light-emitting layer form an interface exciplex. On the one hand, as a competitive process, the high RISC rate of the exciplex is able to inhibit Dexter Energy Transfer (DET) from the exciplex to the fluorescent dye. On the other hand, the enhanced Forster energy transfer from the exciplex to the TADF material is able to greatly promote the ratio of singlet excitons (>25%) of the TADF material while inhibiting triplet excitons (<75%), which also inhibits the DET from the TADF material to the fluorescent dye. Therefore, the exciton loss of the DET is able to be greatly reduced in the two paths, which is beneficial to improve the device efficiency.

3. The fluorescent dye in the organic electroluminescent device provided by the present disclosure may employ an ordinary fluorescent dye, and the hole transport layer material is combined with the first host material in the light-emitting layer to form an interface exciplex, which results in a higher efficiency compared to the existing device. The fluorescent dye in the present disclosure may also employ a fluorescent dye having an electron-inert terminal substituent. An inert unit may spatially shield an electronic active core of the fluorescent dye due to the large spatial effect of the inert unit, which not only increases the intermolecular distance, but also reduces the orbital overlap of adjacent molecules. Therefore, the DET is able to be effectively inhibited.

4. In the organic electroluminescent device provided by the present disclosure, the TADF material and the first host material are adaptively doped in the light-emitting layer, so that the TADF material is diluted to inhibit the quenching effect caused by aggregation, thereby further improving the device efficiency.

BRIEF DESCRIPTION OF THE DRAWINGS

In order to illustrate the technical solutions of specific embodiments of the present disclosure or the prior art more clearly, the drawings used in the description of the specific embodiments or the prior art are briefly described below. Apparently, the drawings in the following description are only some embodiments of the present disclosure, and a person of ordinary skill in the art can obtain other drawings according to these drawings without involving any inventive effort.

DETAILED DESCRIPTION OF THE INVENTION

The technical solutions of the present disclosure are clearly and completely described below with reference to the accompanying drawings. It is apparent that the described embodiments are a part of the embodiments of the present disclosure, and not all of the embodiments. All other embodiments obtained by a person of ordinary skill in the art based on the embodiments of the present disclosure without involving an inventive effort fall within the protection scope of the present disclosure.

The present disclosure may be implemented in different forms, and should not be construed to be limited to the embodiments set forth herein. In contrast, these embodiments are provided such that the present disclosure will be thorough and complete. Moreover, the concept of the present disclosure is thoroughly presented to those skilled in the art. The present disclosure is defined only by the appended claims. In the accompanying drawings, the dimensions and the relative dimensions of layers and regions are exaggerated for clarity. When an element, such as a layer, is "formed on" or "disposed on" another element, the element can be directly disposed on another element, or an intermediate element may be present. In contrast, when an element is "directly formed on" or "directly disposed on" another element, there is no intermediate element.

Embodiment 1

Figures 1, 2:
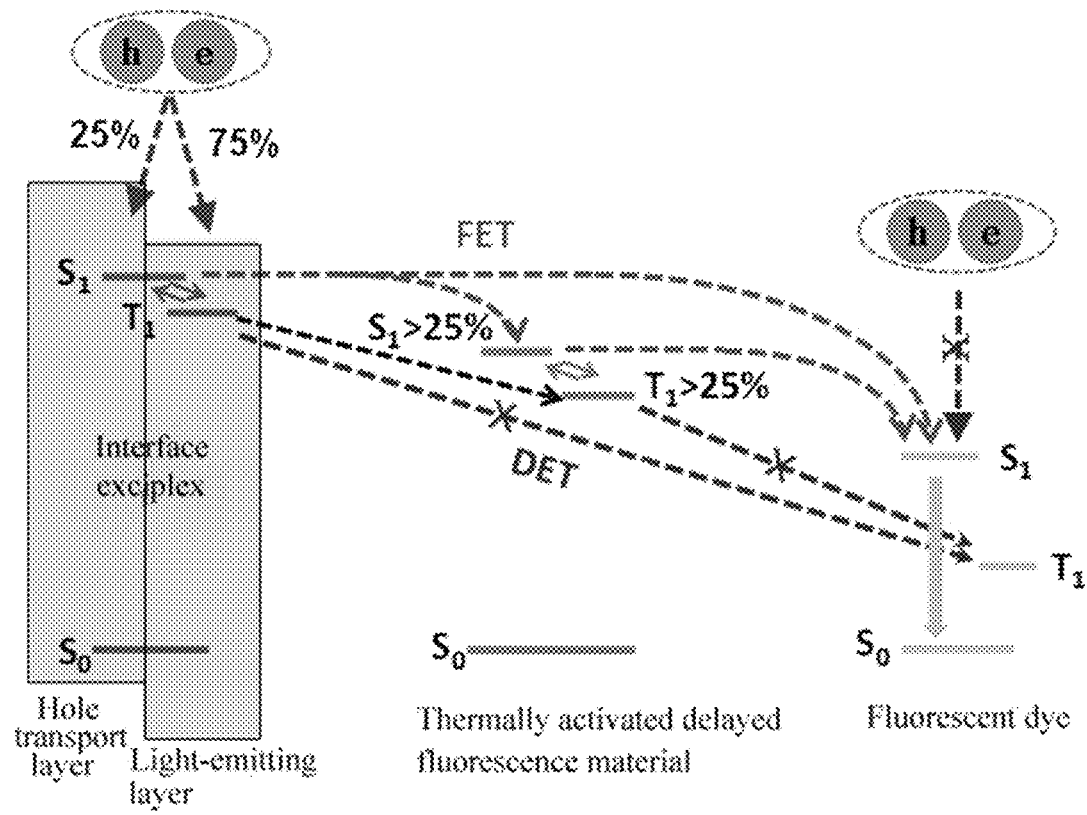
FIG. 1 is a schematic diagram of energy level transfer of an organic electroluminescent device according to the present disclosure.
FIG. 2 is a schematic structural diagram of an organic electroluminescent device according to Embodiment 1 of the present disclosure.

As shown in FIG. 2, this embodiment provides an organic electroluminescent device, including a first electrode 1, a hole transport layer 2, a light-emitting layer 3, an electron transport layer 4, an electron injection layer 5, and a second electrode 6. As an embodiment of the present disclosure, specifically, the structure of the organic electroluminescent device is: ITO/TAPC (50 nm)/TCTA (10 nm)/light-emitting layer (30 nm)/BPBiPA (30 nm)/LiF (0.5 nm)/Al (150 nm). That is, the material of the first electrode 1 is ITO, the material of the hole transport layer 2 includes TAPC and TCTA, TCTA also has an electron blocking effect, and the material of the electron transport layer 4 is BPBiPA, the material of the electron injection layer 5 is LiF, and the material of the second electrode is Al. The light-emitting layer 3 includes a first host material PhCzTRz, a TADF sensitizer PXZ-DPS, and a fluorescent dye PhtBuPAD. Layer thickness data is shown in the parentheses. The specific structures are as follows:

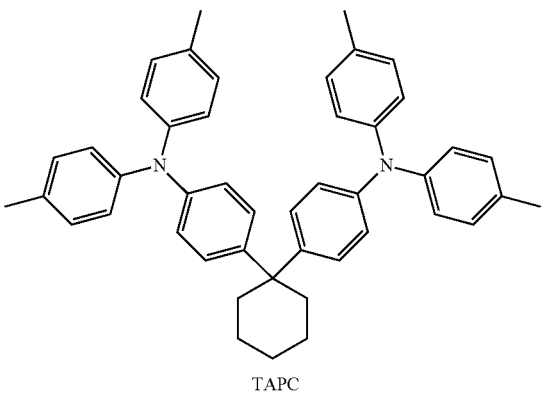

TAPC

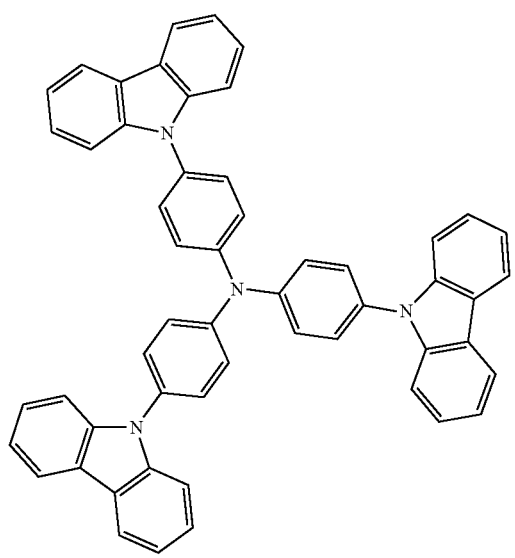

TCTA

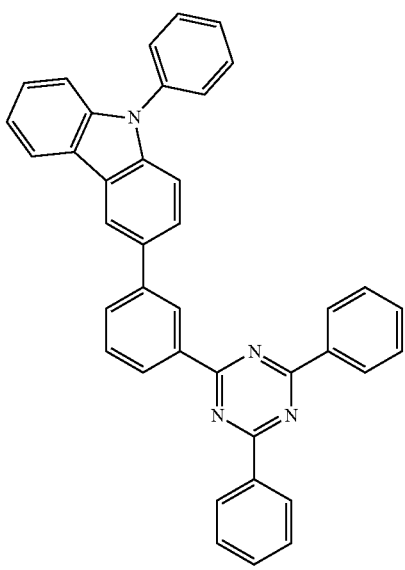

PhCzTrz

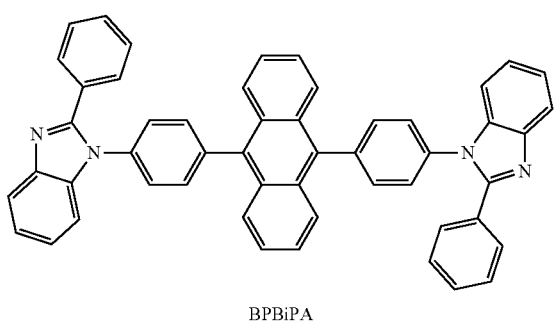

BPBiPA

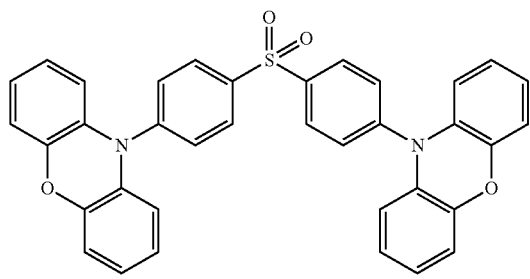

PXZ-DPS

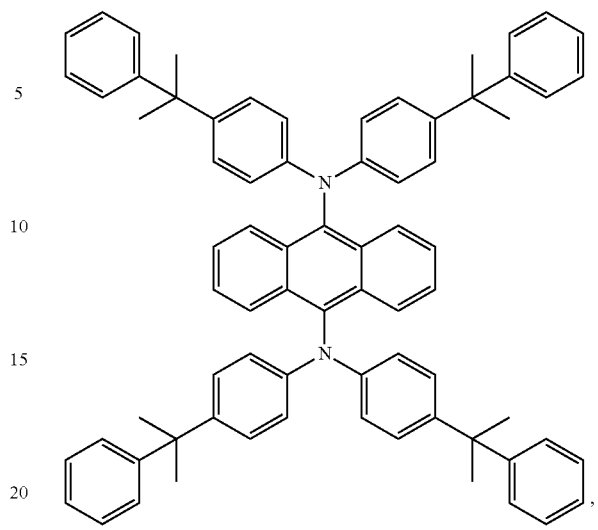

PhtBuPAD the triplet level is: TCTA>PhCzTrz>PhtBuPAD.

Figure 3:
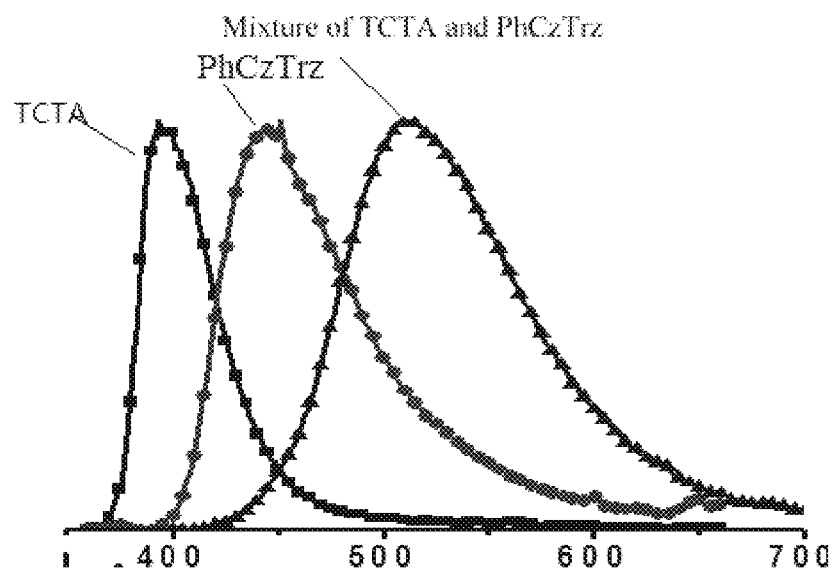
FIG. 3 is a fluorescence spectrum (emission spectrum) of a hole transport layer material, a first host material, and a mixture thereof according to Embodiment 1 of the present disclosure.

As shown in FIG. 3, the spectrum of the mixture of the hole transport layer material and the first host material (the mixture of TCTA and PhCzTrz) is significantly red-shifted compared to the emission spectra of the hole transport layer material (TCTA) and the first host material (PhCzTrz), which indicates that an interface exciplex is formed by the hole transport layer material and the first host material. An interface exciplex is formed by the hole transport layer material and the first host material in the light-emitting layer 3. The energy level transfer of an organic electroluminescent device containing the interface exciplex is shown is FIG. 1. On the one hand, as a competitive process, the high RISC rate of the exciplex can inhibit the DET from the exciplex to the fluorescent dye. On the other hand, the enhanced Forster energy transfer from the exciplex to the TADF material can greatly promote the ratio of singlet excitons (>25%) of the TADF material while inhibiting triplet excitons (<75%), which also inhibits the DET from the TADF material to the fluorescent dye. Therefore, the exciton loss of the DET can be greatly reduced in such two paths, which is beneficial to improve the device efficiency.

Moreover, the TADF material and the first host material are adaptively doped in the light-emitting layer, so that the TADF material is diluted to inhibit the quenching effect caused by aggregation, thereby further improving the device efficiency.

Embodiment 2

This embodiment provides an organic electroluminescent device having the same structure as Embodiment 1, except that the first host material is replaced with:

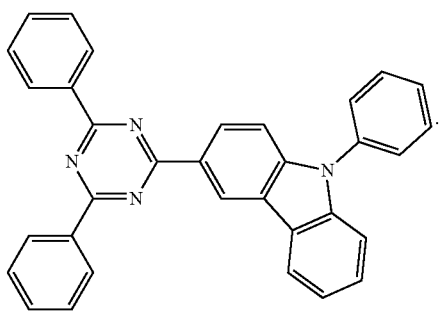 [SMILES: c1ccc(-c2nc(-c3ccccc3)nc(-c3ccc4c(c3)c3ccccc3n4-c3ccccc3)n2)cc1]

Embodiment 3

This embodiment provides an organic electroluminescent device having the same structure as Embodiment 1, except that the TADF material is replaced with:

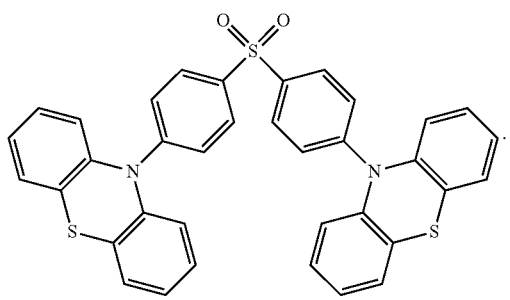 [SMILES: O=S(=O)(c1ccc(N2c3ccccc3Sc3ccccc32)cc1)c1ccc(N2c3ccccc3Sc3ccccc32)cc1]

Embodiment 4

This embodiment provides an organic electroluminescent device having the same structure as Embodiment 1, except that the TCTA in the hole transport material is replaced with:

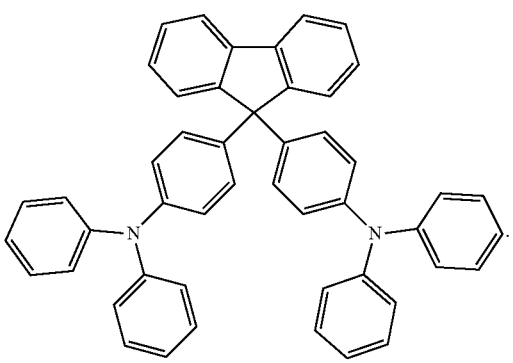 [SMILES: c1ccc(N(c2ccccc2)c2ccc(C3(c4ccc(N(c5ccccc5)c5ccccc5)cc4)c4ccccc4-c4ccccc43)cc2)cc1]

Embodiment 5

This embodiment provides an organic electroluminescent device having the same structure as Embodiment 1, except that the first host material is replaced with:

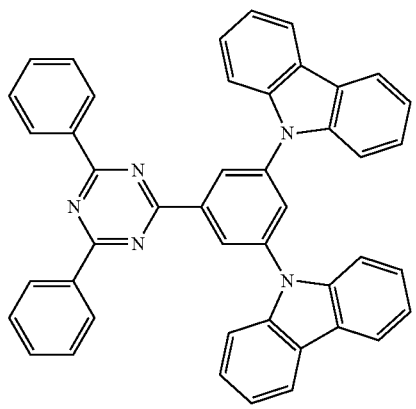

Embodiment 6

This embodiment provides an organic electroluminescent device having the same structure as Embodiment 1, except that the first host material is replaced with:

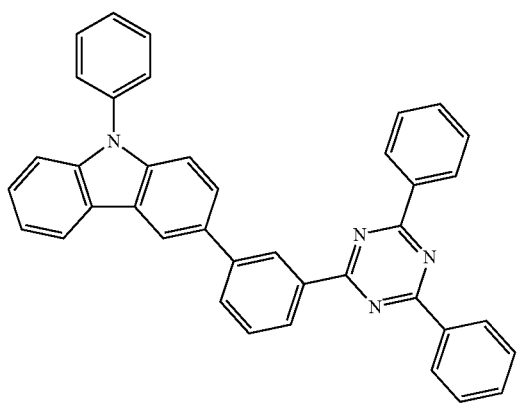

Embodiment 7

This embodiment provides an organic electroluminescent device having the same structure as Embodiment 1, except that the hole transport material is replaced with:

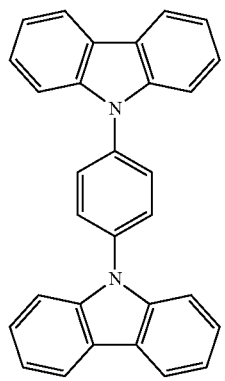

Embodiment 8

This embodiment provides an organic electroluminescent device having the same structure as Embodiment 1, except that the hole transport material is replaced with:

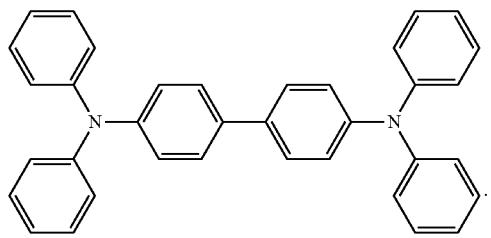 [SMILES: c1ccc(N(c2ccccc2)c2ccc(-c3ccc(N(c4ccccc4)c4ccccc4)cc3)cc2)cc1]

Embodiment 9

This embodiment provides an organic electroluminescent device having the same structure as Embodiment 1, except that the TADF material is replaced with:

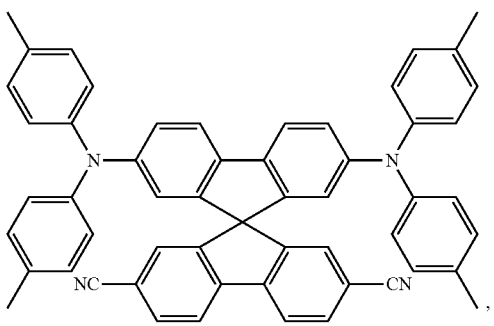 [SMILES: Cc1ccc(N(c2ccc(C)cc2)c2ccc3c(c2)C2(c4cc(C#N)ccc4-c4ccc(C#N)cc42)c2cc(N(c4ccc(C)cc4)c4ccc(C)cc4)ccc2-3)cc1]

Embodiment 10

This embodiment provides an organic electroluminescent device having the same structure as Embodiment 1, except that the TADF material is replaced with:

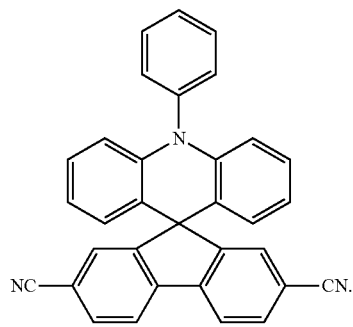 [SMILES: N#Cc1ccc2c(c1)C1(c3cc(C#N)ccc3-2)c2ccccc2N(c2ccccc2)c2ccccc21]

In Embodiments 1-10, the fluorescent dye accounts for 0.1-20% of the mass of the first host material, preferably 0.5-10%. The TADF material accounts for 5-80% of the mass of the first host material, preferably 10-40%.

In the foregoing embodiments, the first host material may be selected from the following compounds:

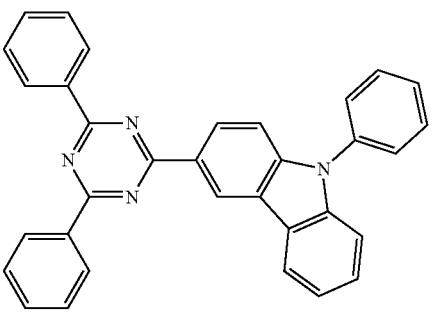

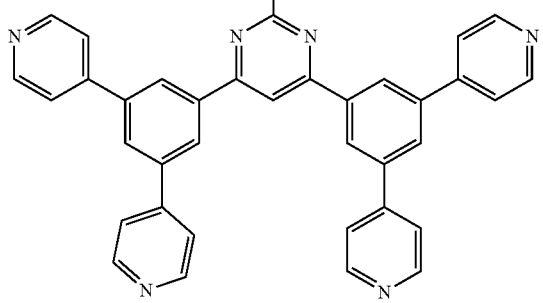

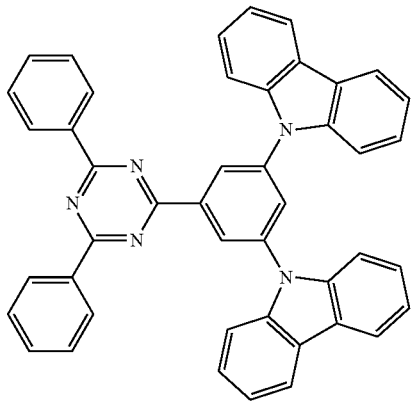

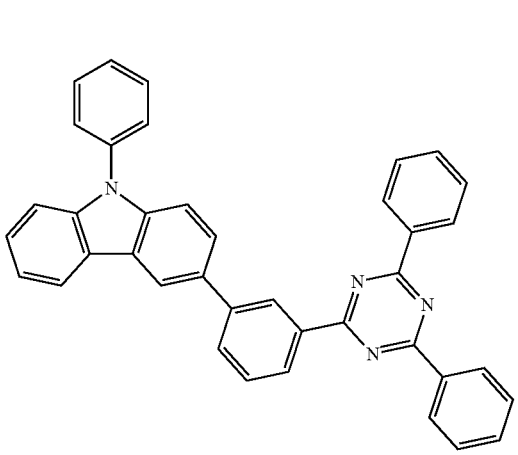

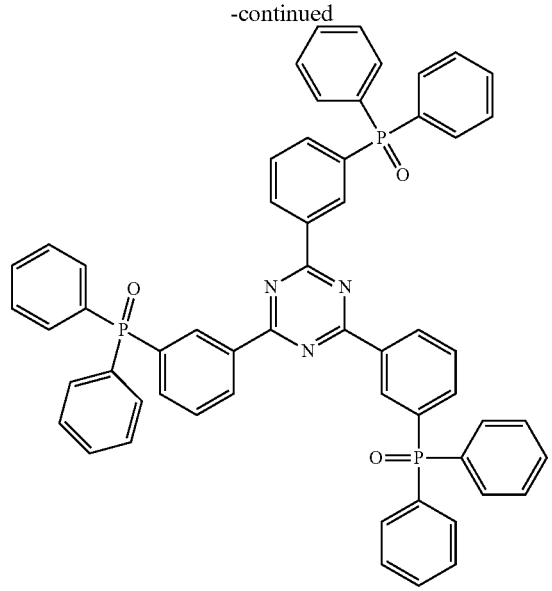
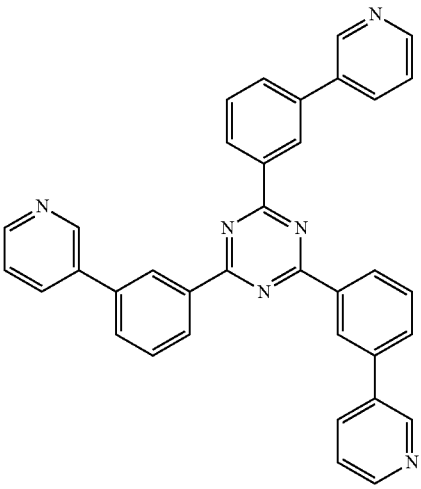
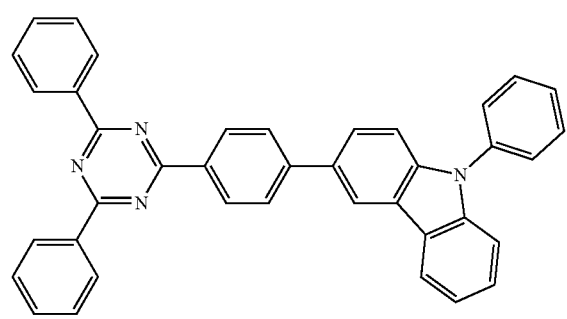
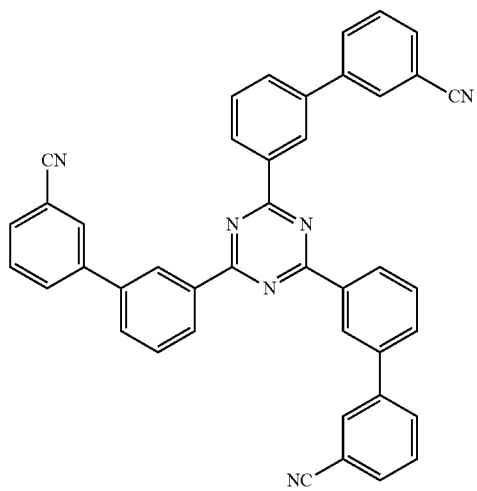
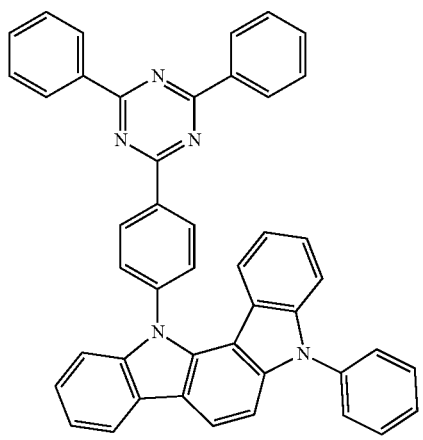
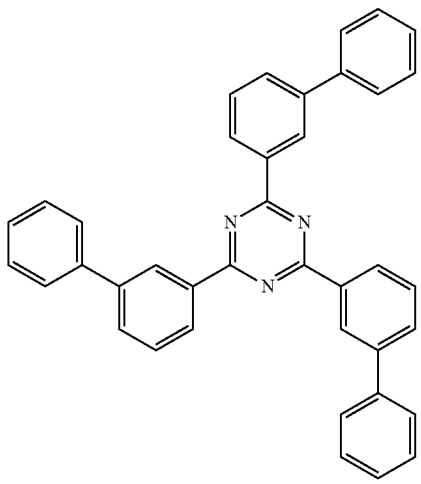

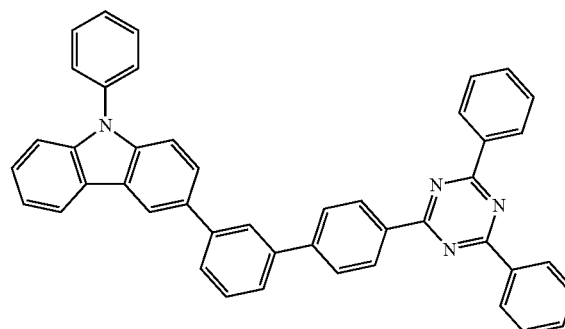
The hole transport material may be selected from the following compounds:
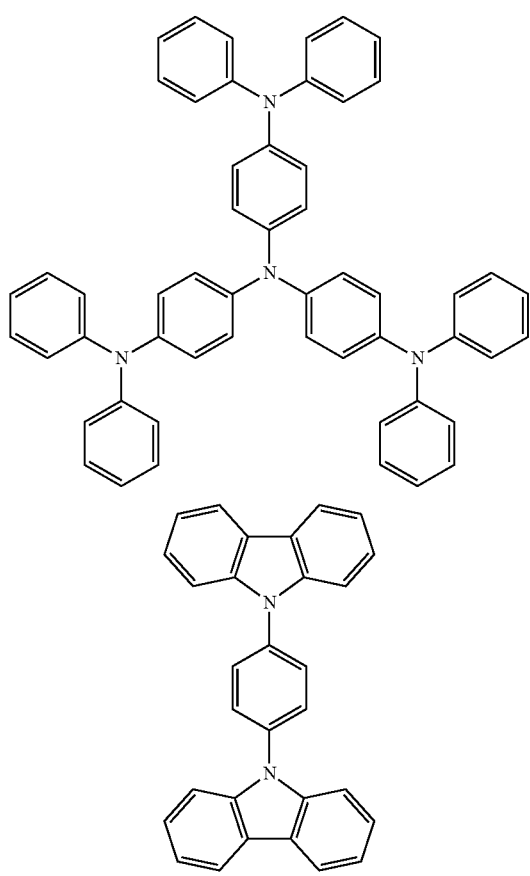
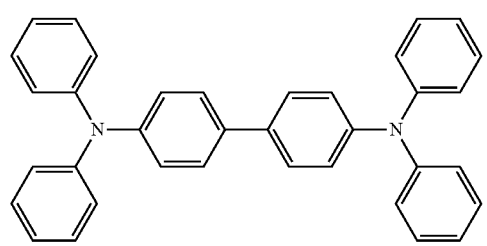
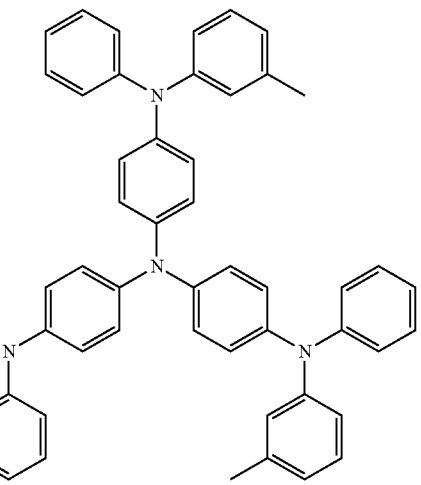
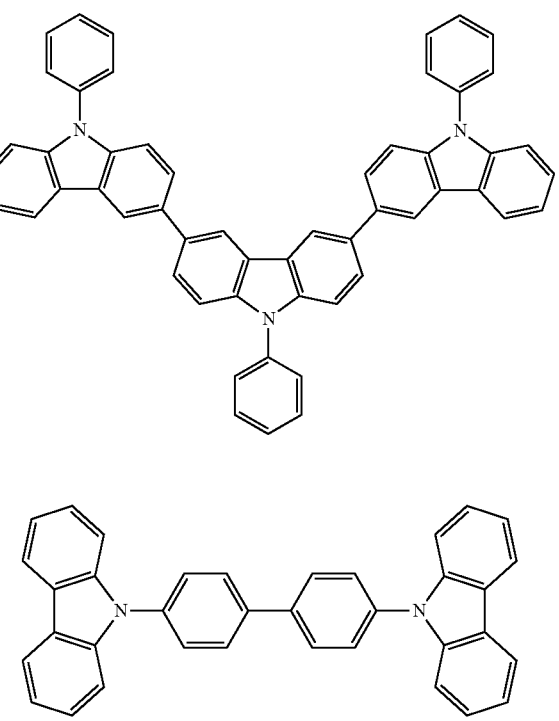

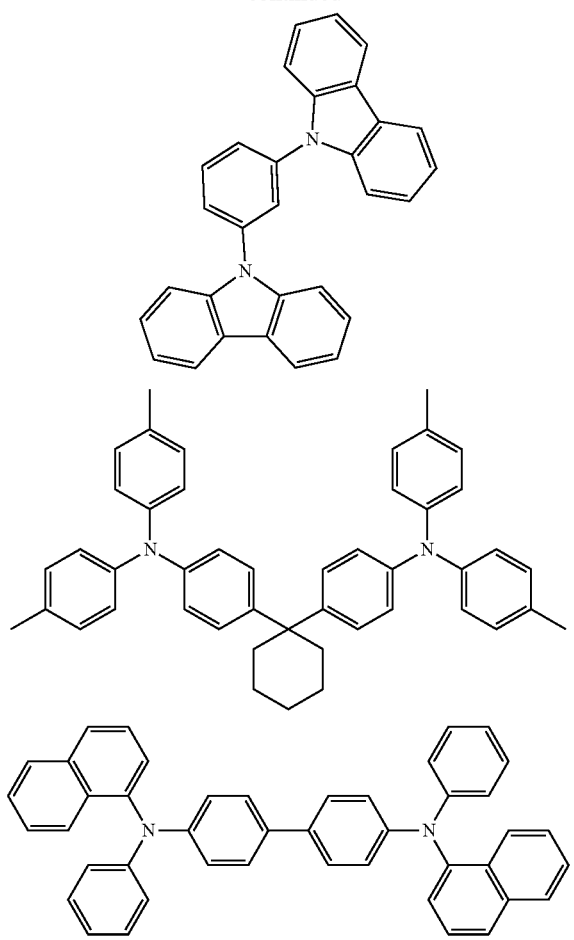
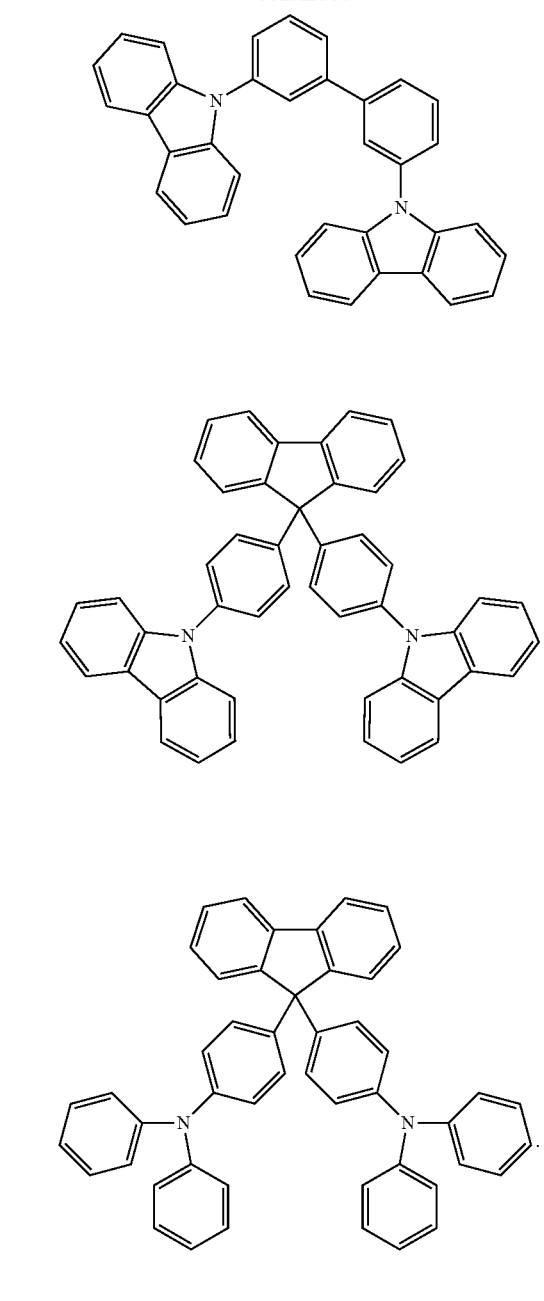
The fluorescent dye may be selected from the following compounds:
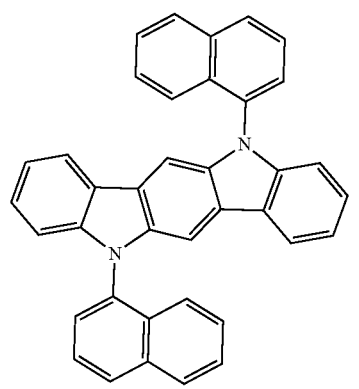
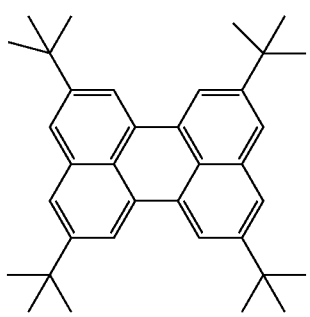

-continued
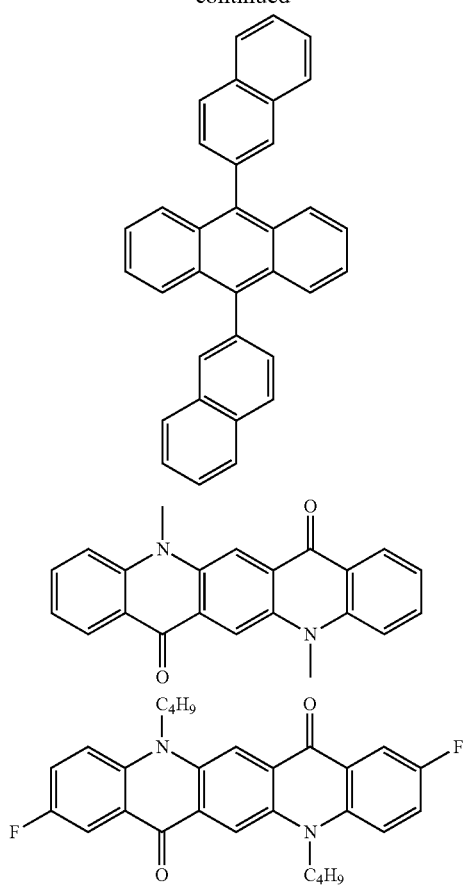
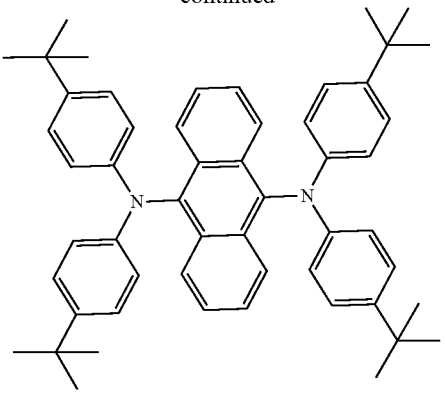
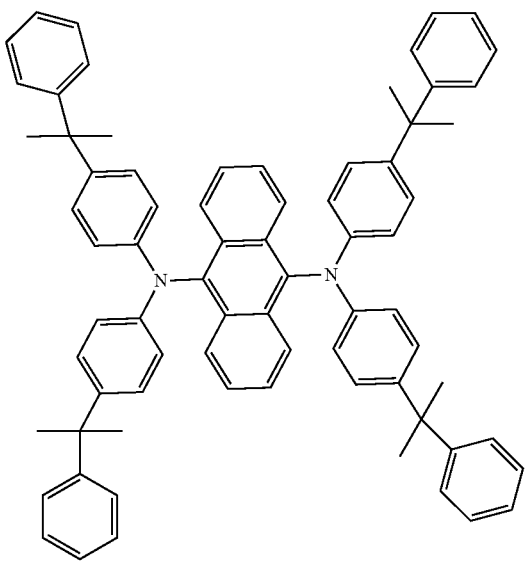
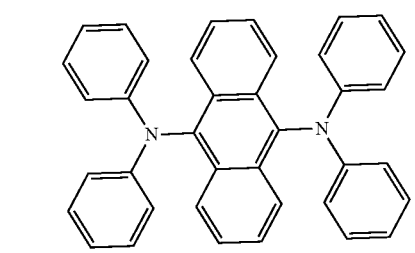
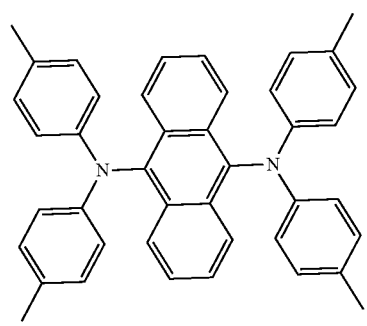
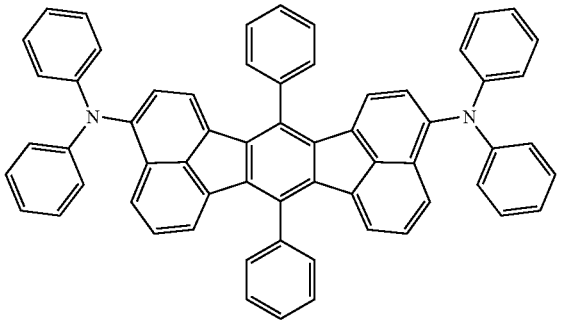

37
-continued
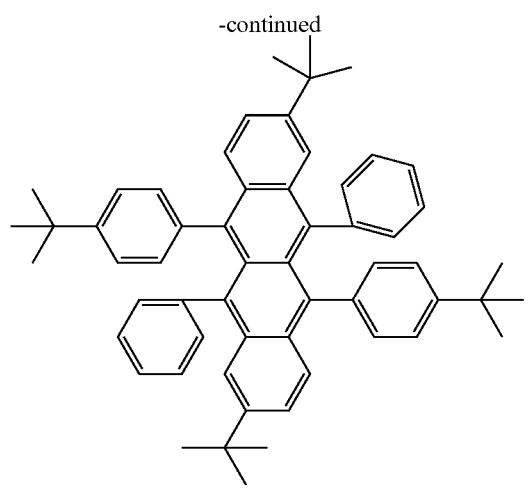
38
-continued
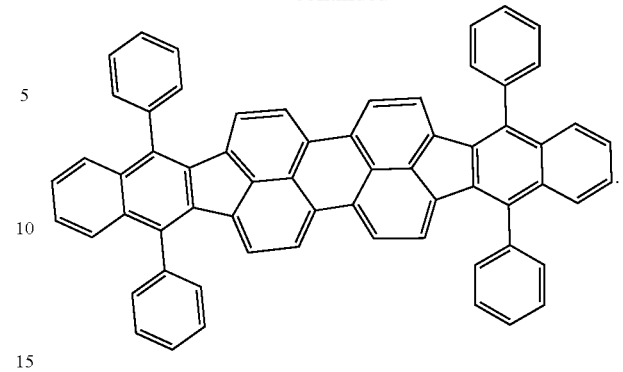
The sensitized material, i.e., the TADF material may be selected from the following compounds:
1-1
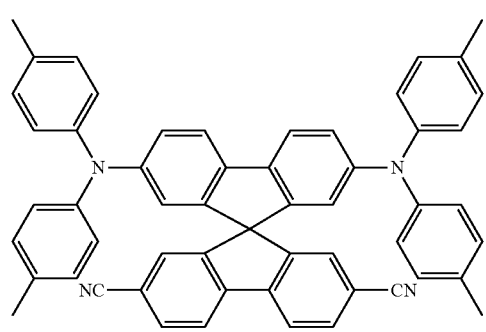
1-2
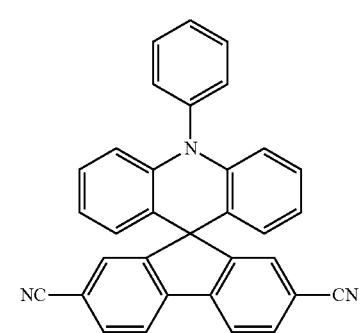
1-3
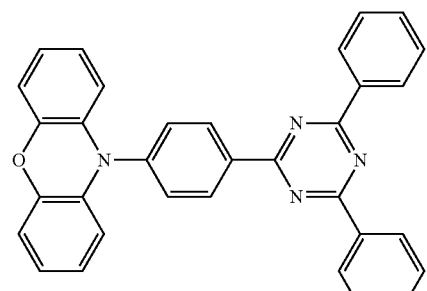
1-4
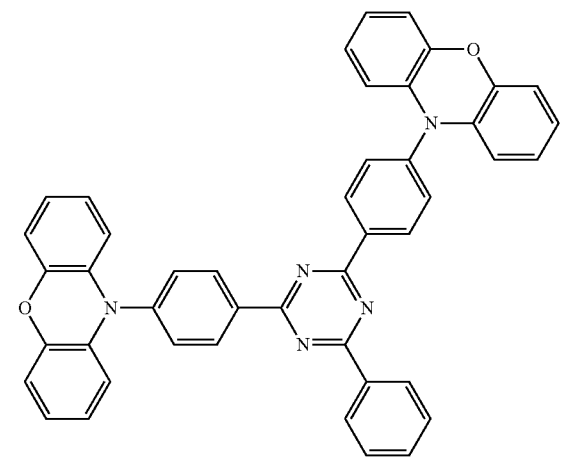

-continued
1-5
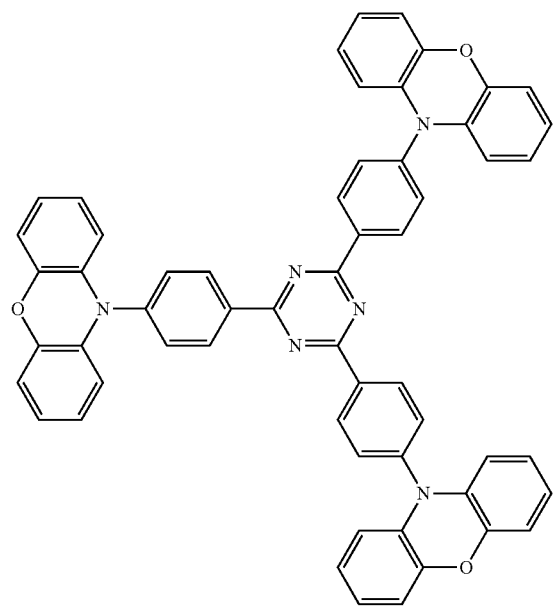
1-6
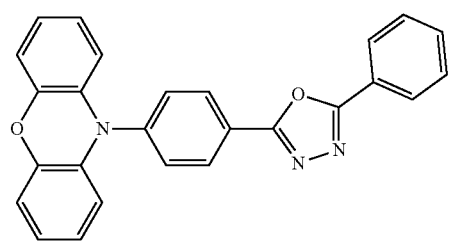
1-7
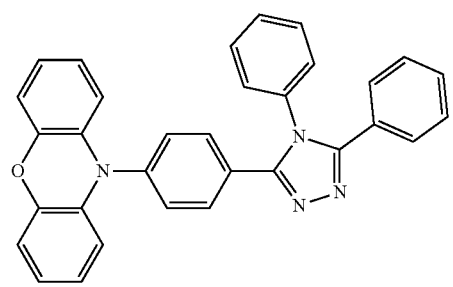
1-8
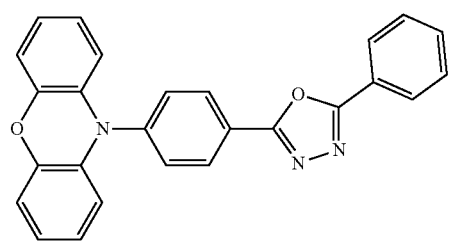
1-9
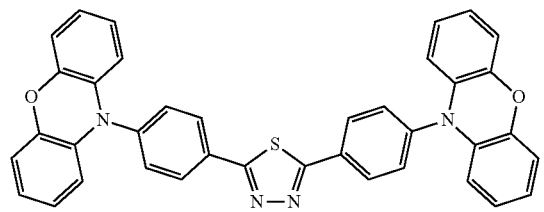
1-10
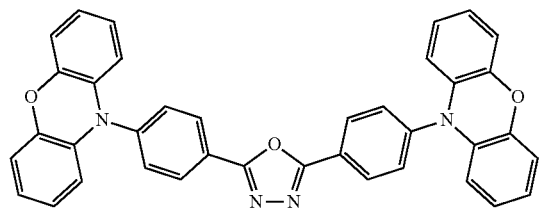
1-11
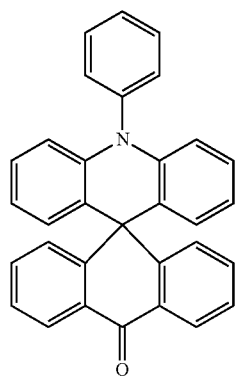
1-12
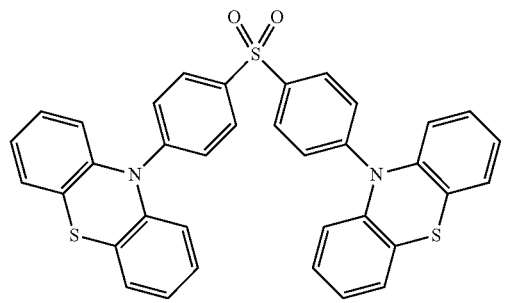

-continued
1-13
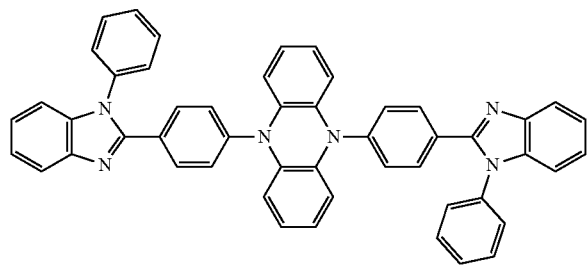
1-14
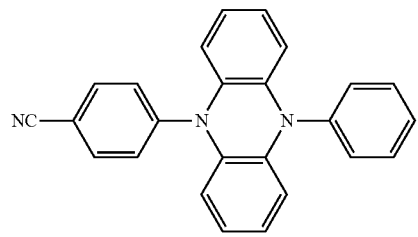
1-15
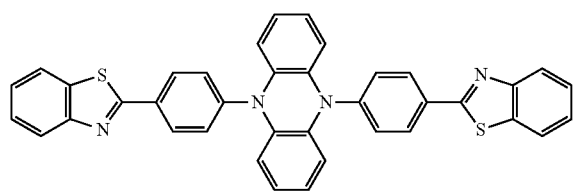
1-16
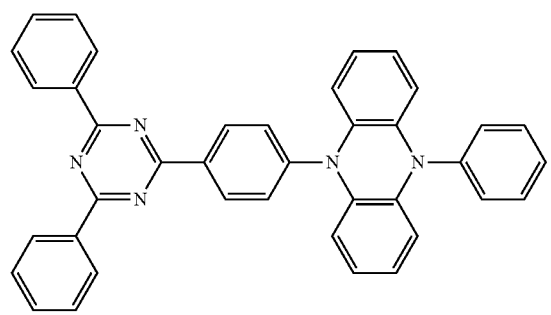
1-17
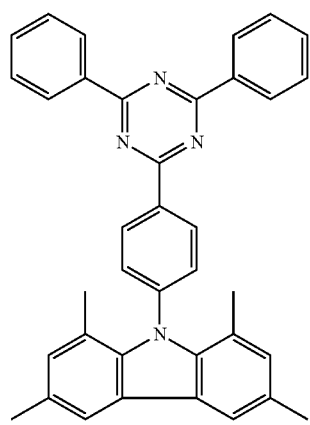
1-18
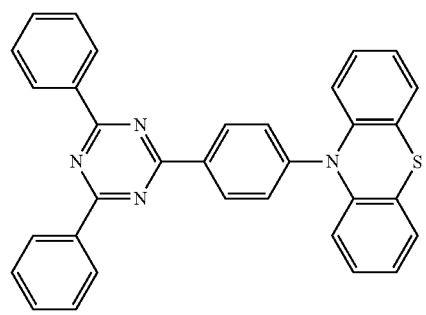
1-19
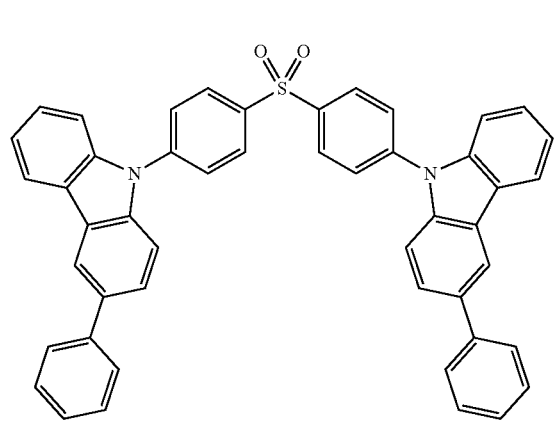
1-20
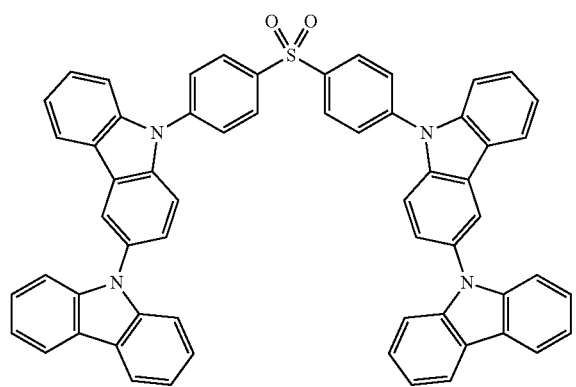

-continued
1-21
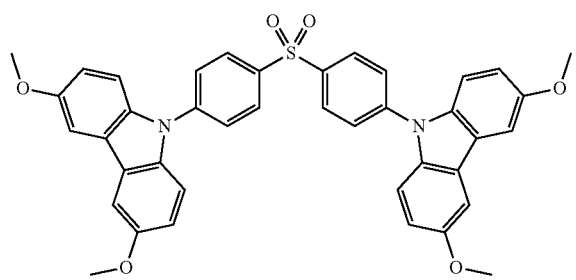
1-22
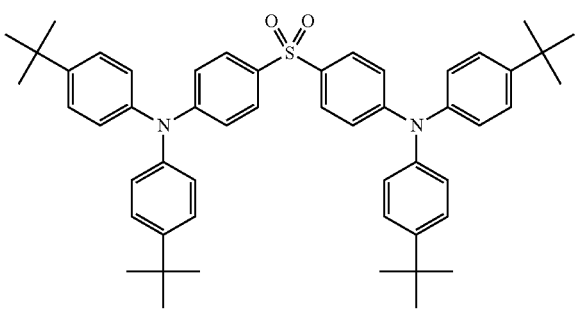
1-23
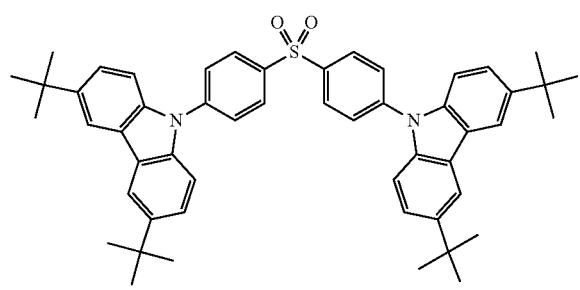
1-24
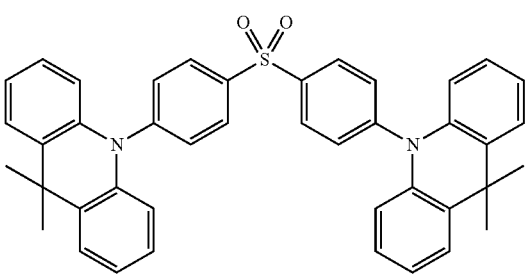
1-25
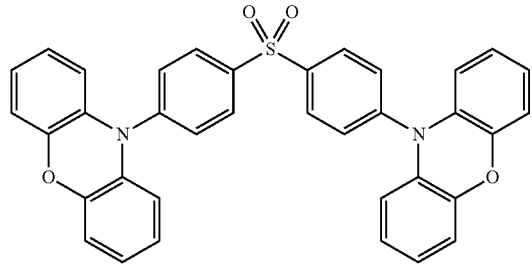
1-26
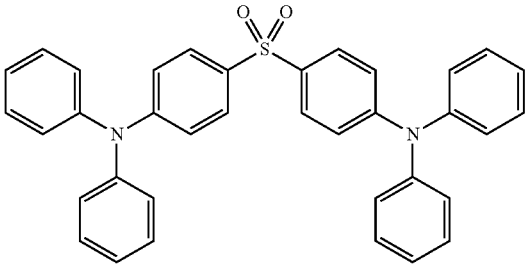
1-27
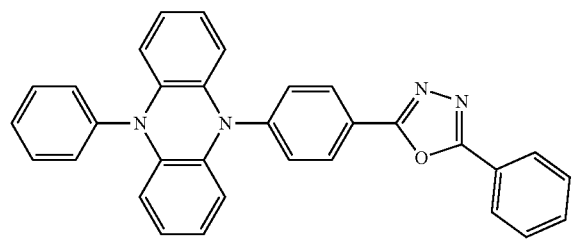
1-28
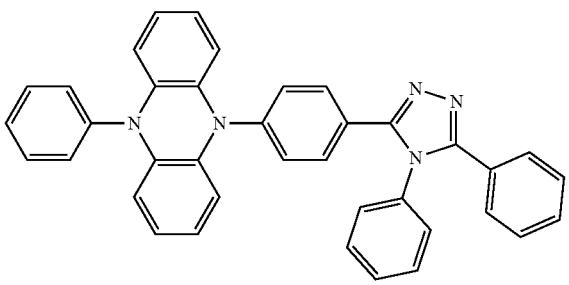
1-29
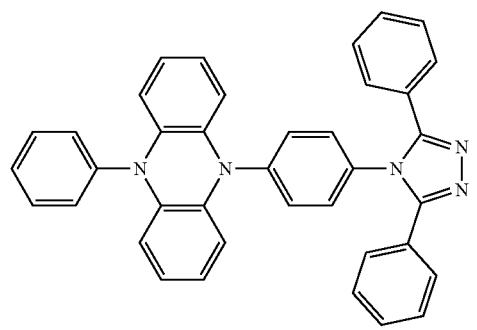
1-30
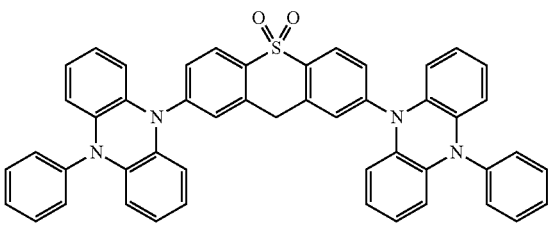

-continued
1-31
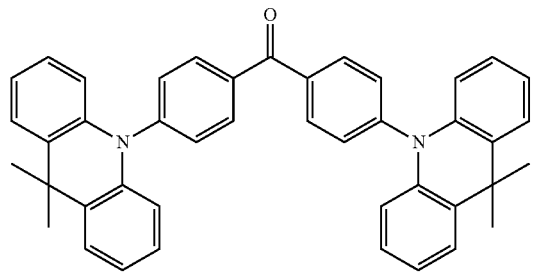
1-32
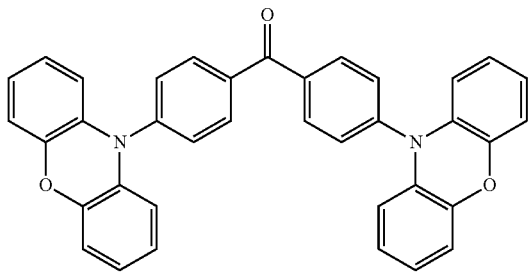
1-33
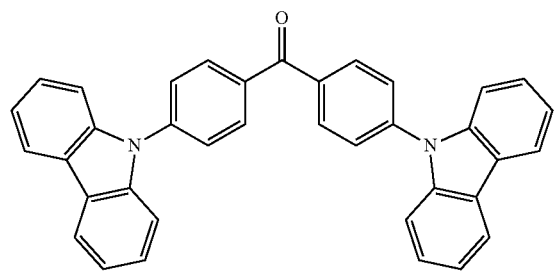
1-34
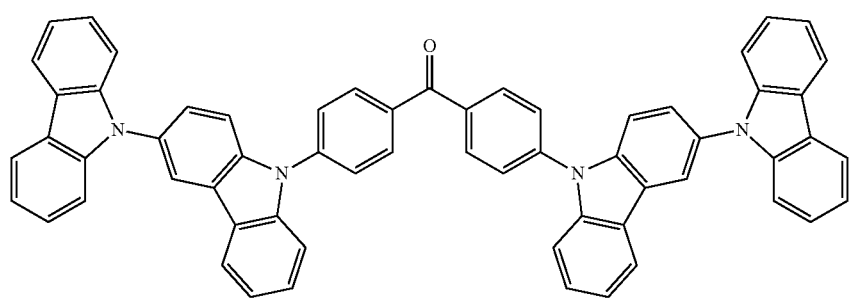
1-35
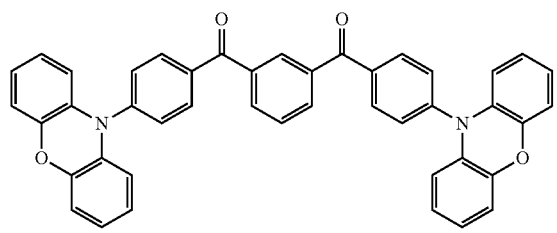
1-36
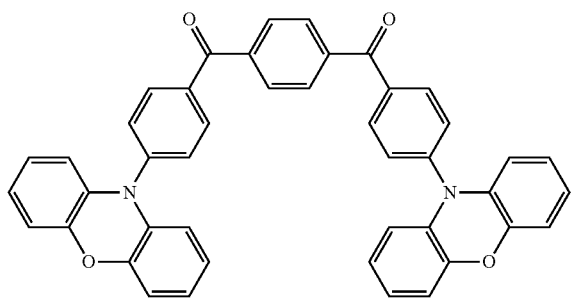
1-37
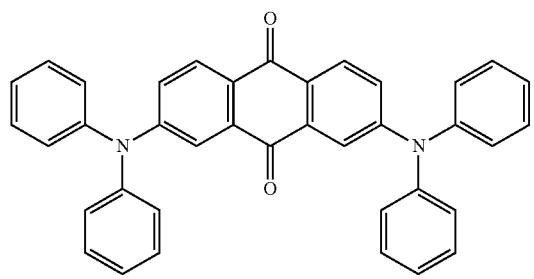
1-38
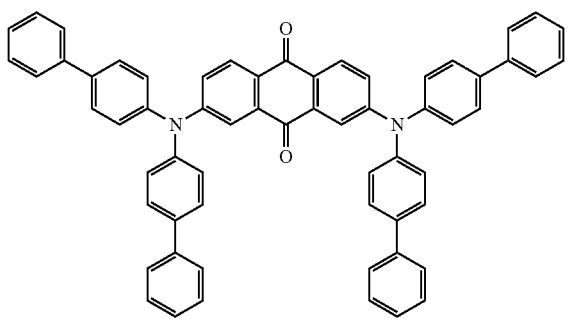

1-39
1-40
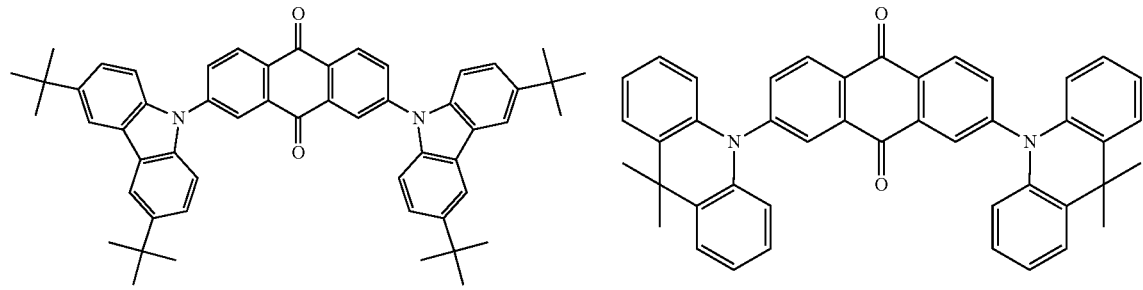
1-41
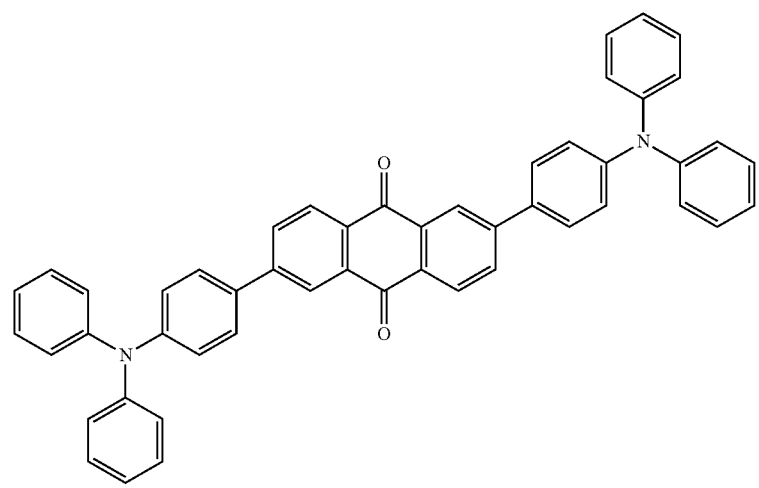
1-42
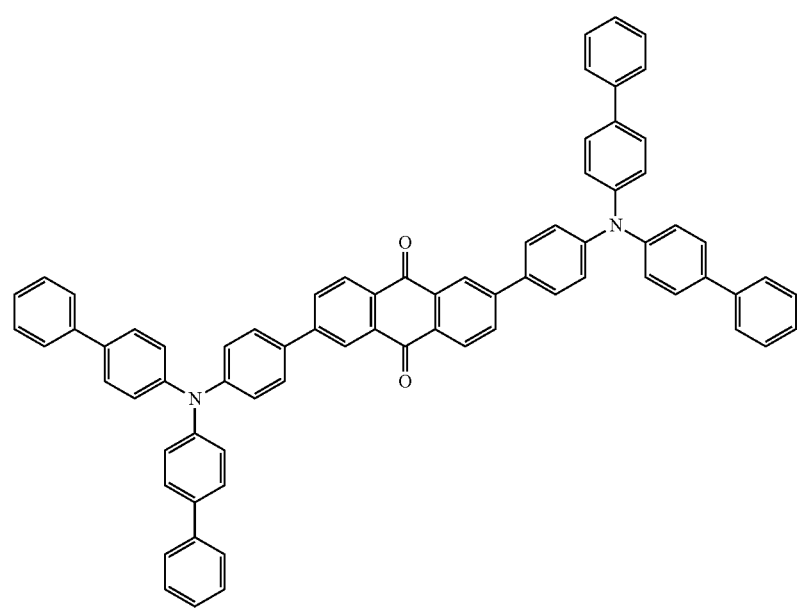

-continued
1-43
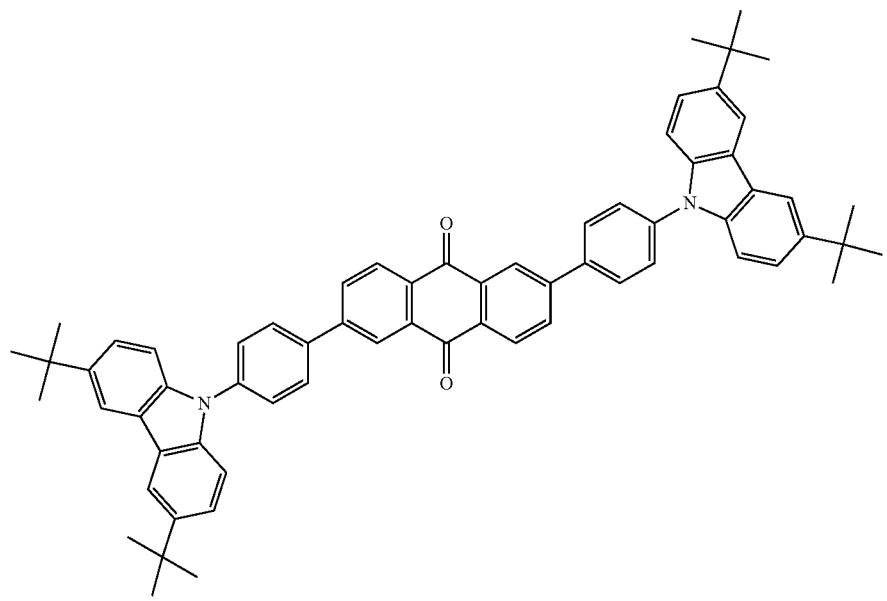
1-44
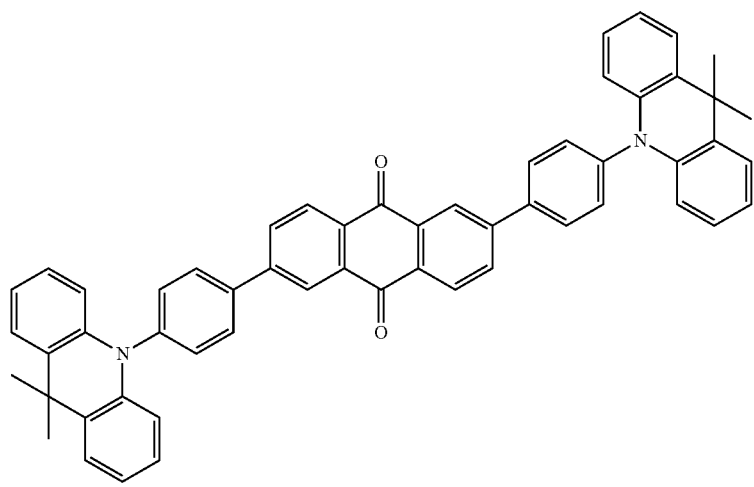
1-45
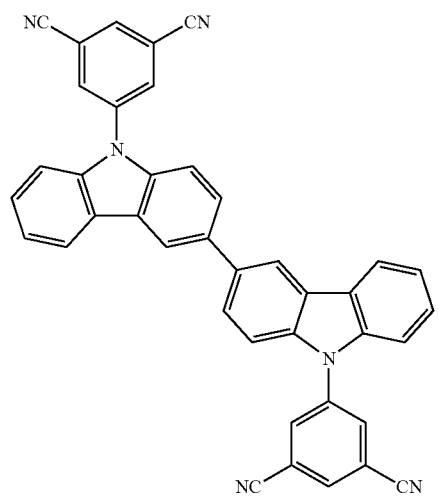
1-46
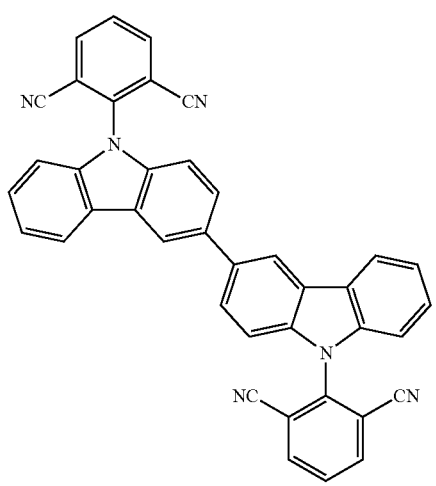

-continued
1-47
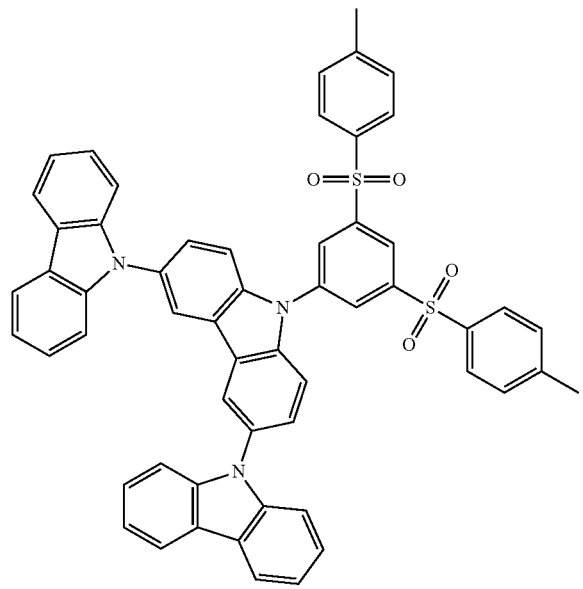
1-48
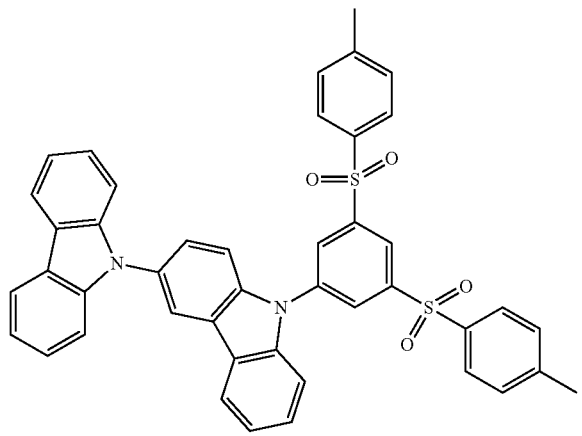
1-49
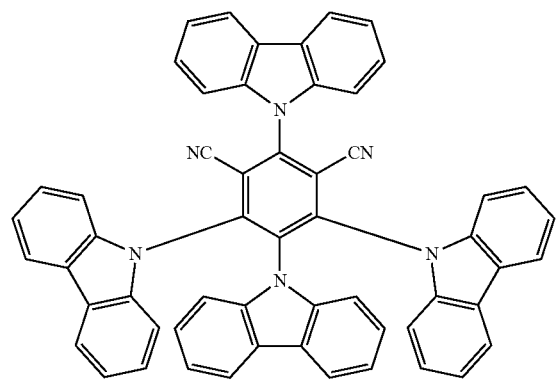
1-50
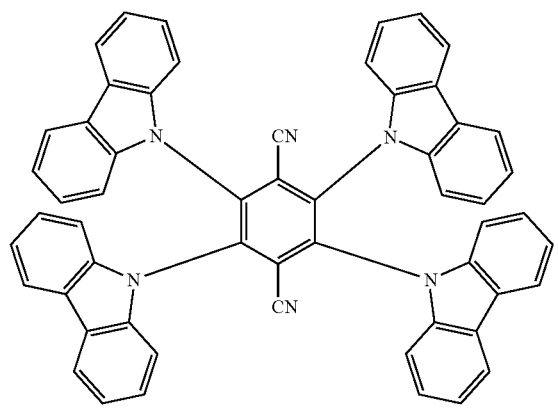
1-51
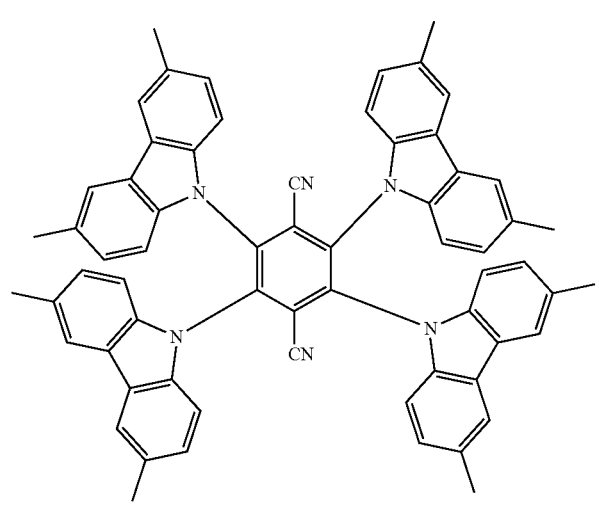

-continued
1-52
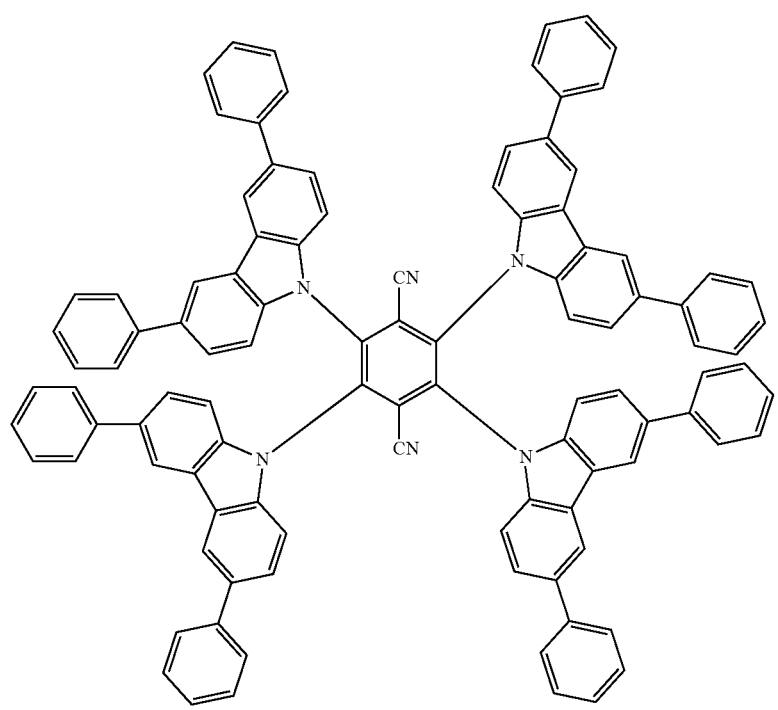
1-53
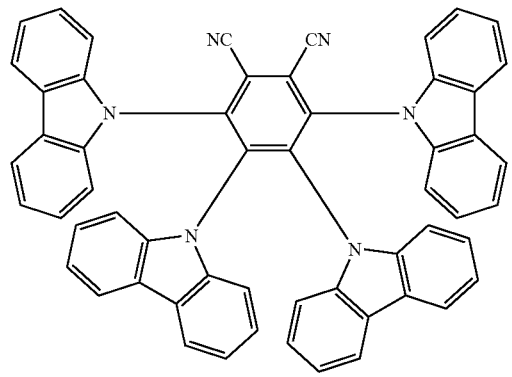
1-54
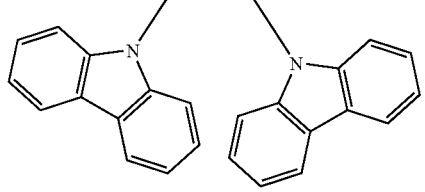
1-55
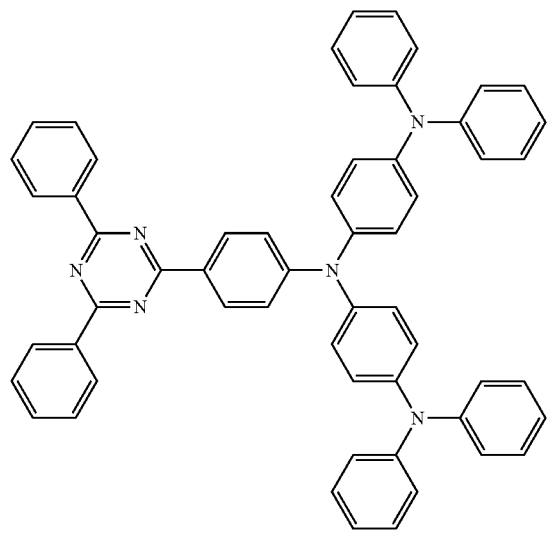
1-56
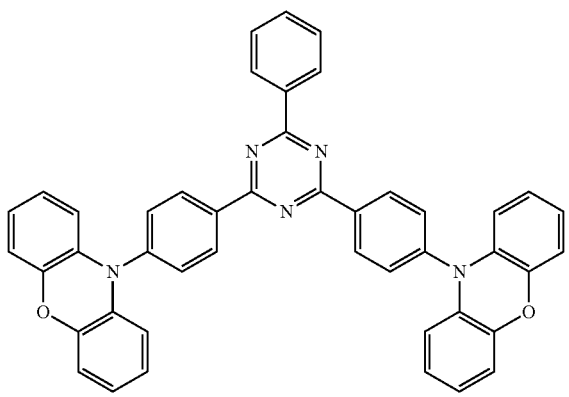

1-57
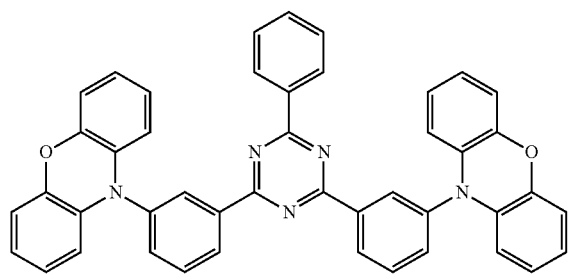
1-58
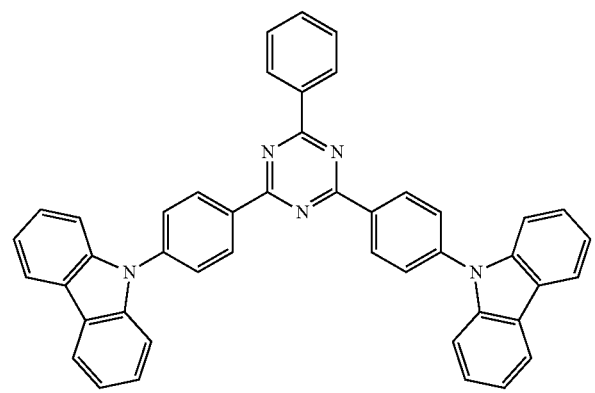
1-59
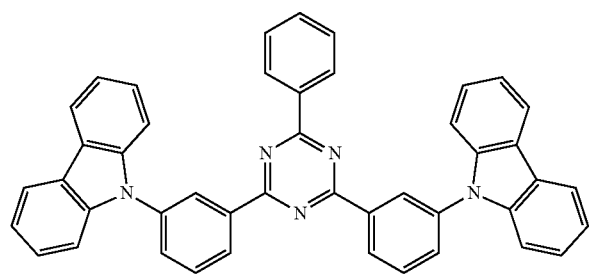
1-60
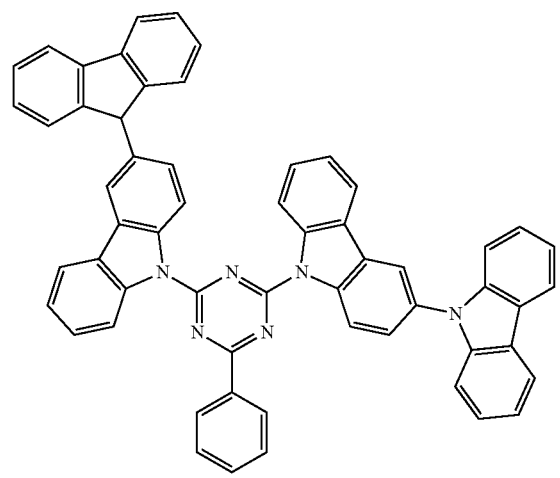
1-61
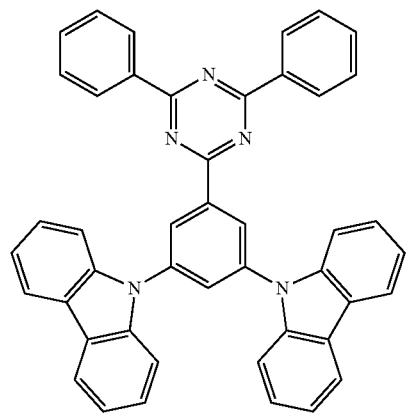
1-62
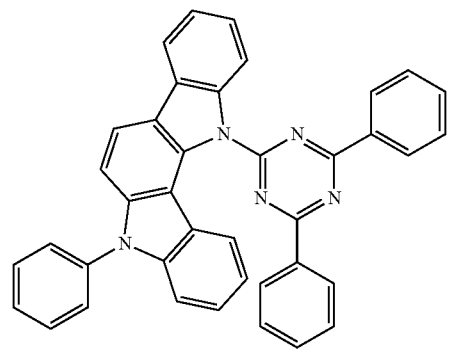

-continued
1-63
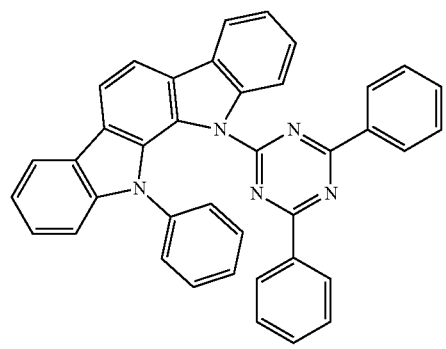
1-64
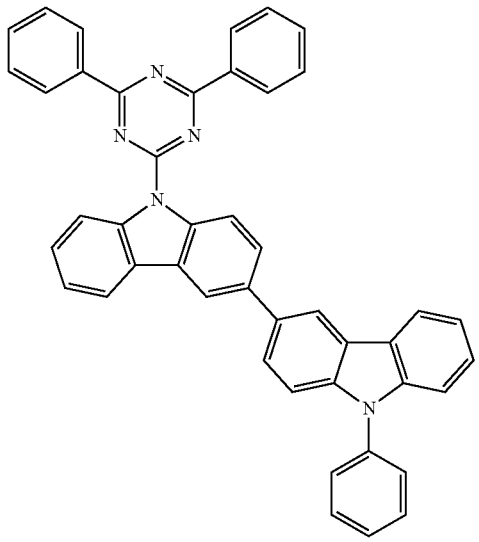
1-65
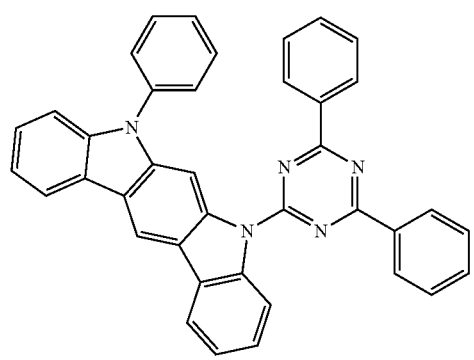
1-66
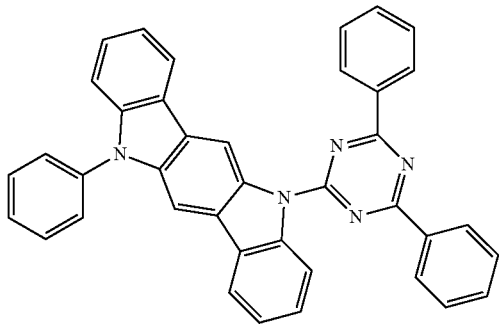
1-67
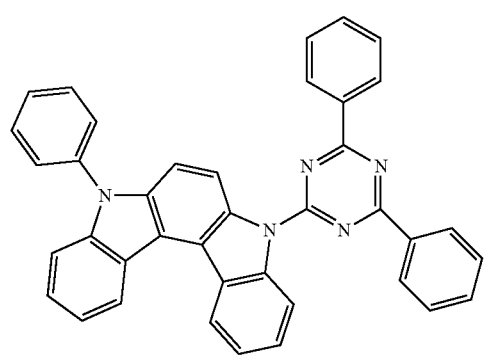
1-68
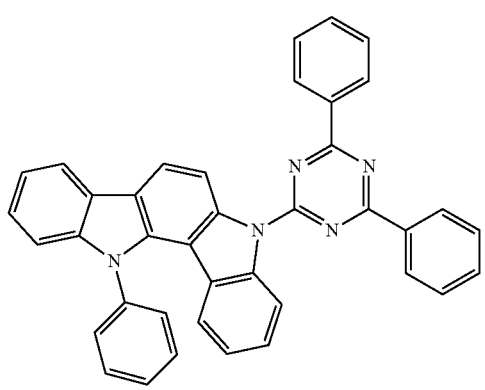
1-69
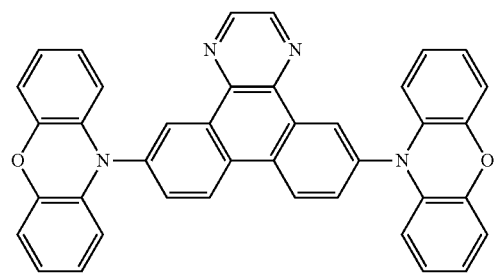
1-70
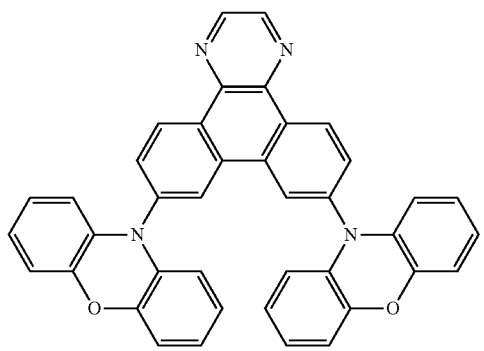

-continued
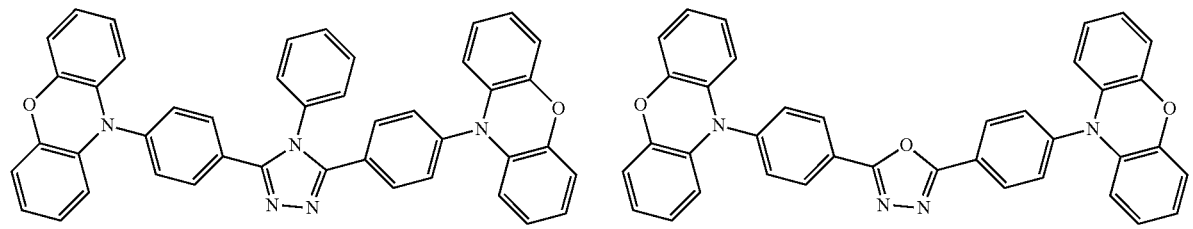
1-71
1-72
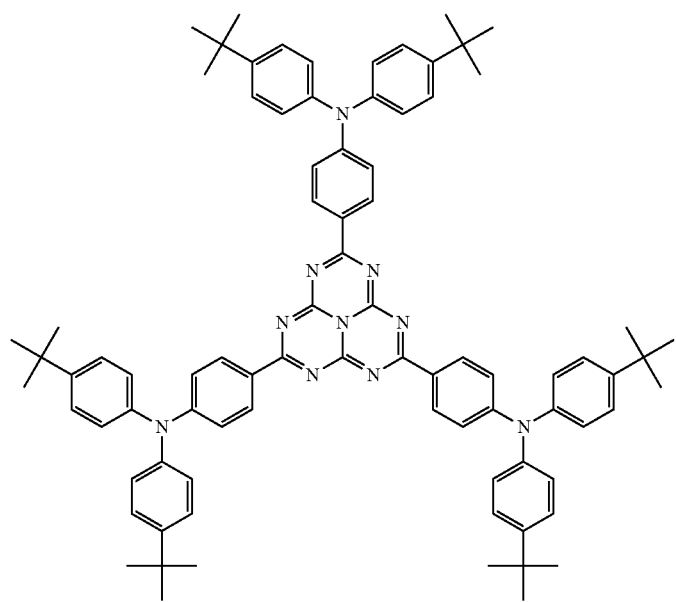
1-73
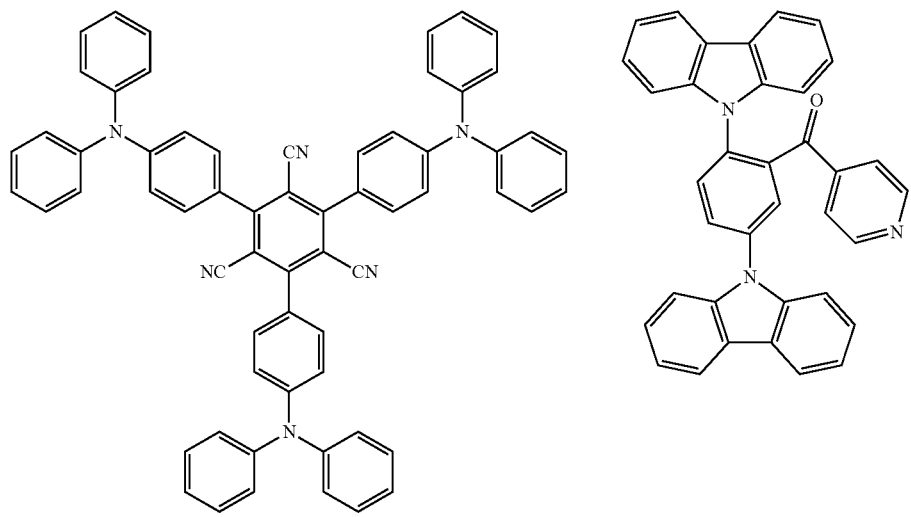
1-74
1-75

1-76 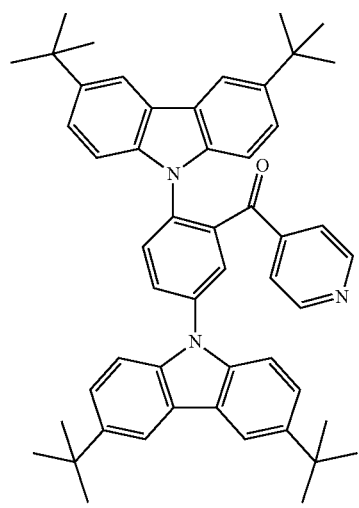
1-77 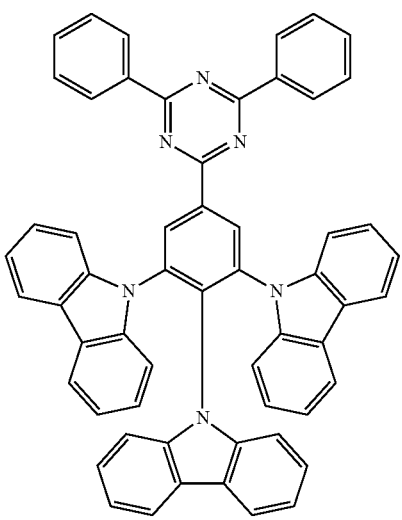
1-78 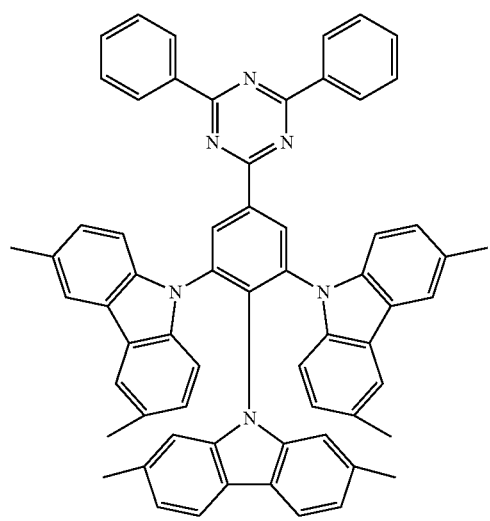
1-79 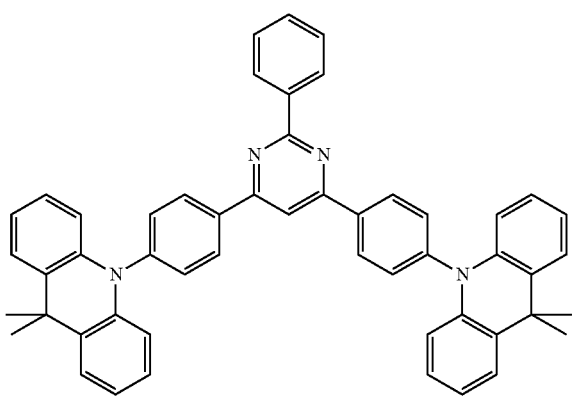
1-80 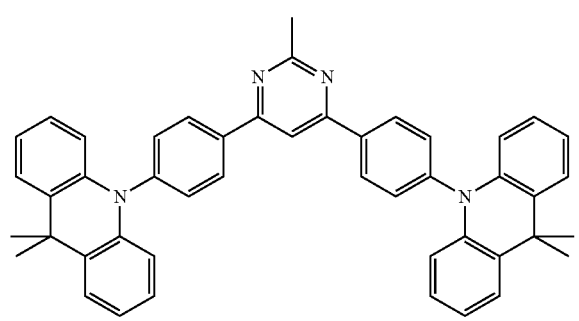
1-81 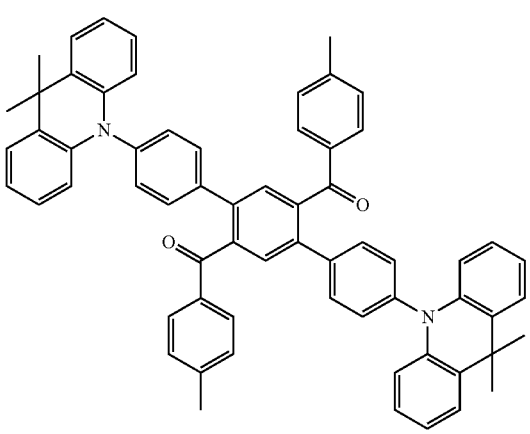

-continued
1-82
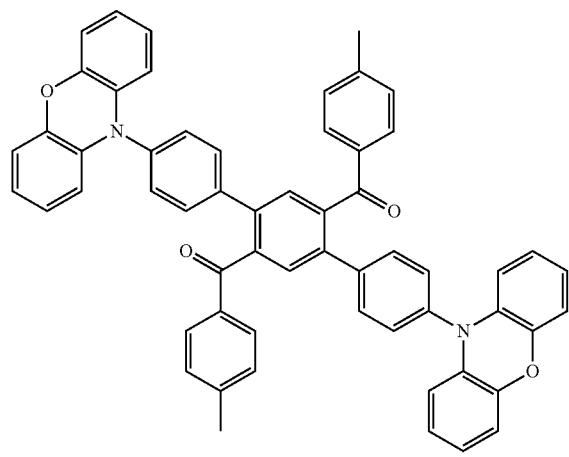
1-83
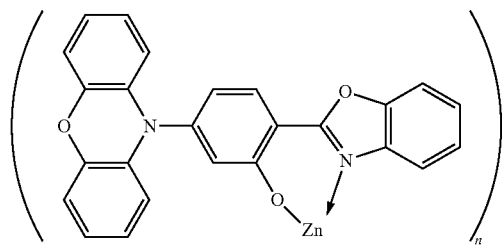
1-84
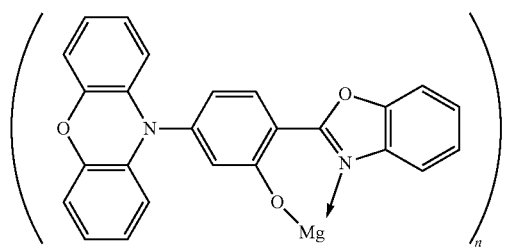
1-85
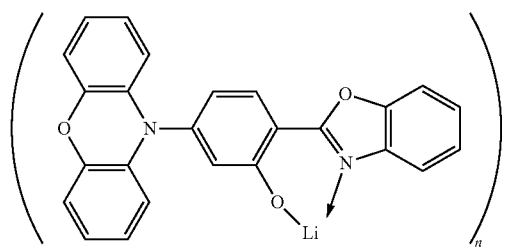
1-86
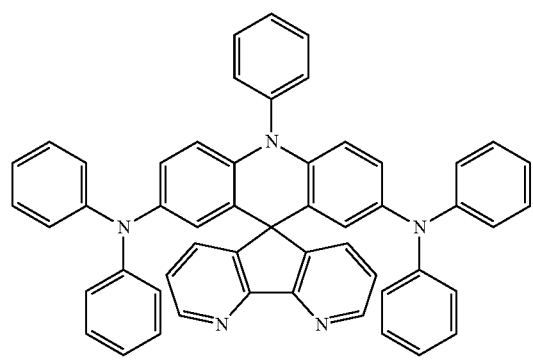
1-87
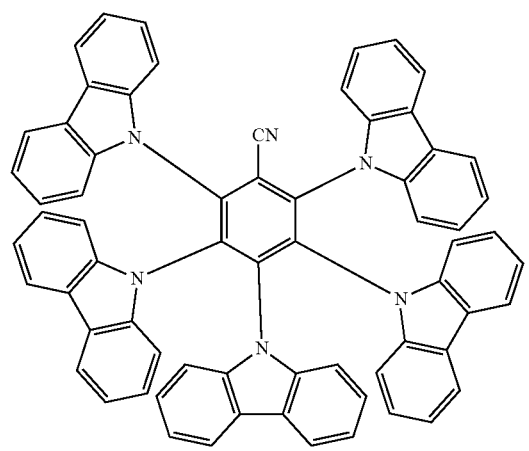

-continued
1-88
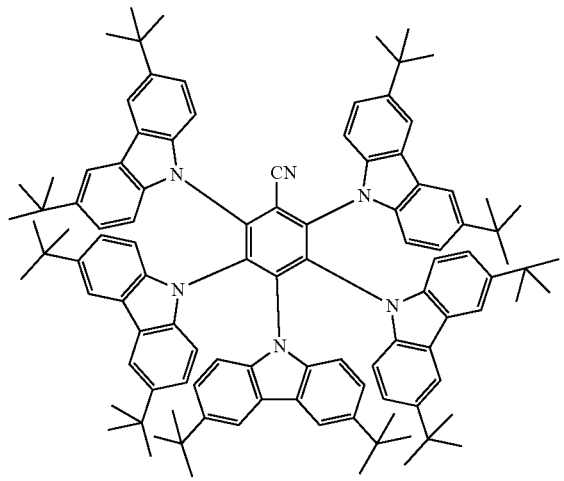
1-89
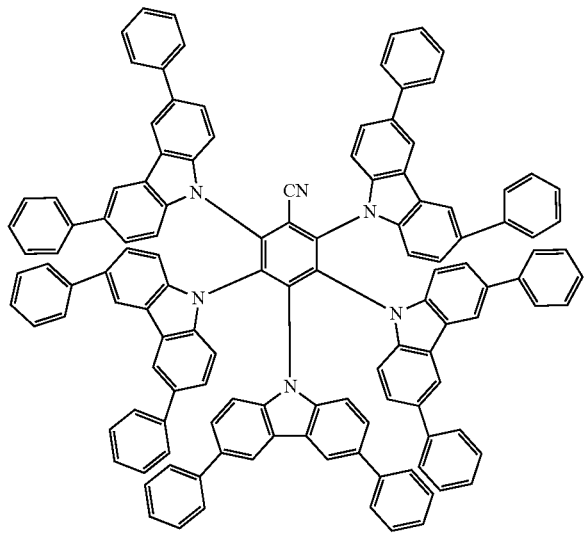
1-90
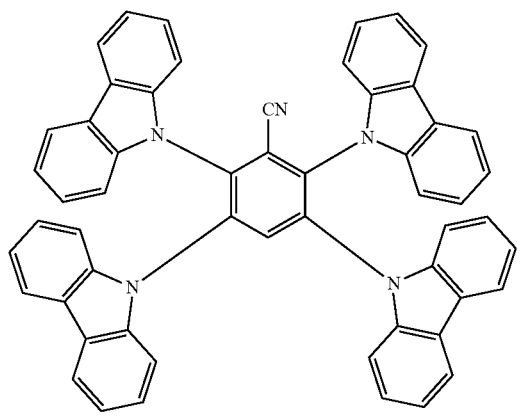
1-91
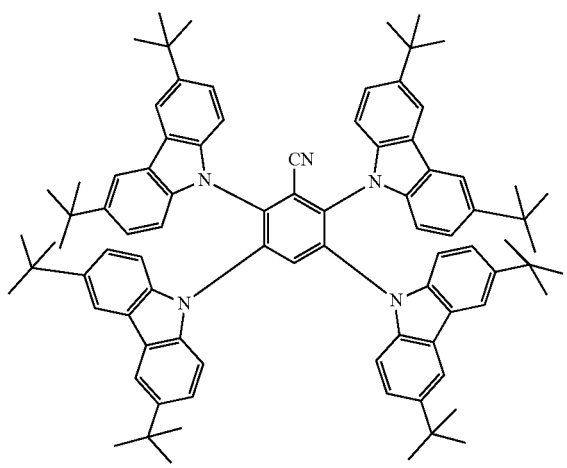
1-92
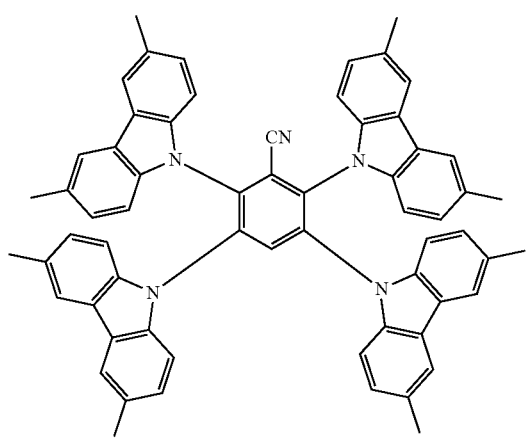
1-93
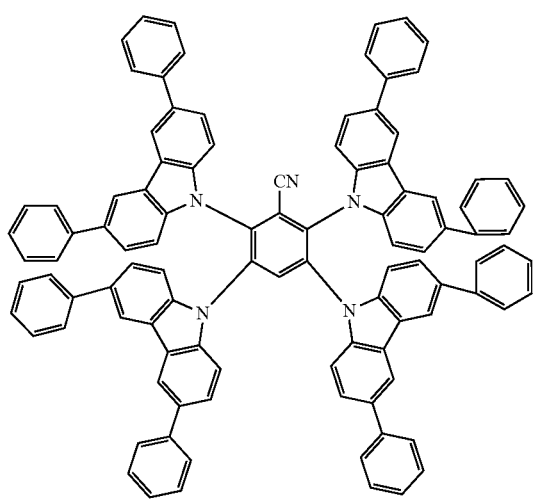

-continued
1-94
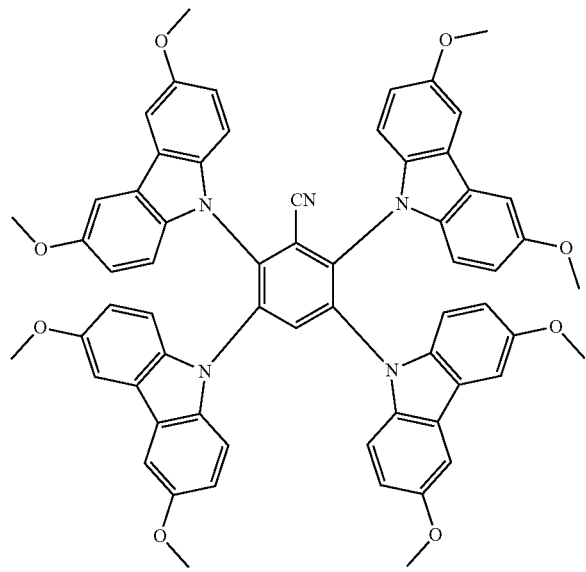
1-95
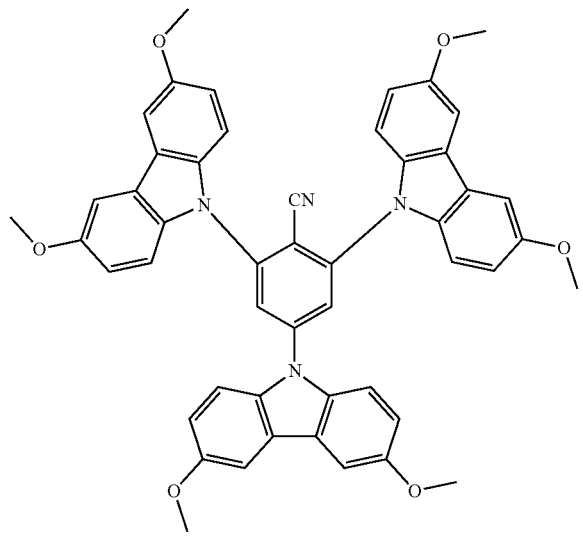
1-96
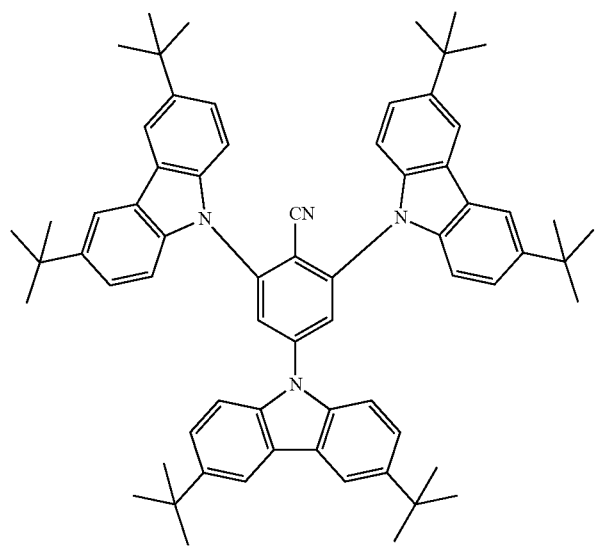
1-97
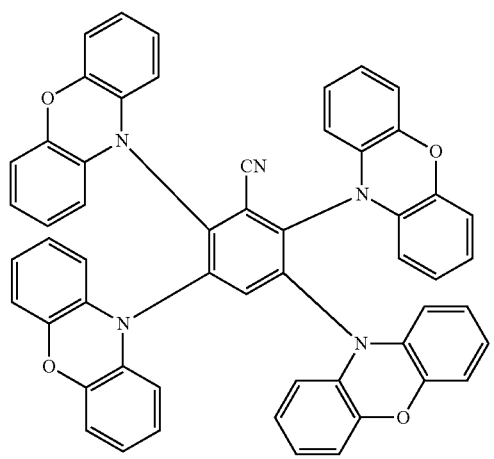
1-98
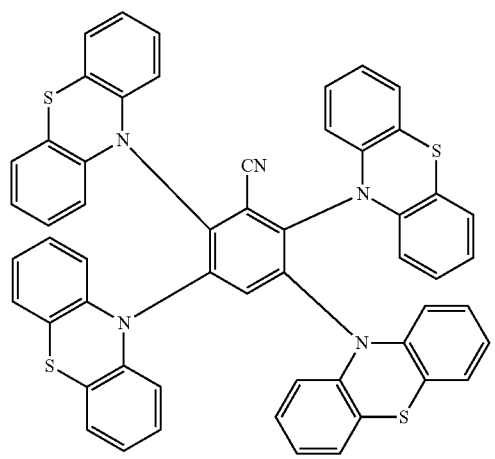
1-99
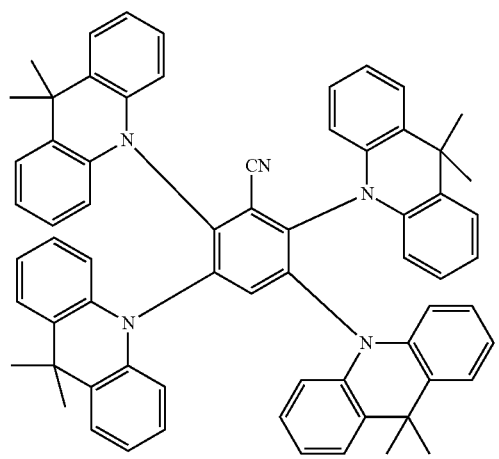

-continued 1-100

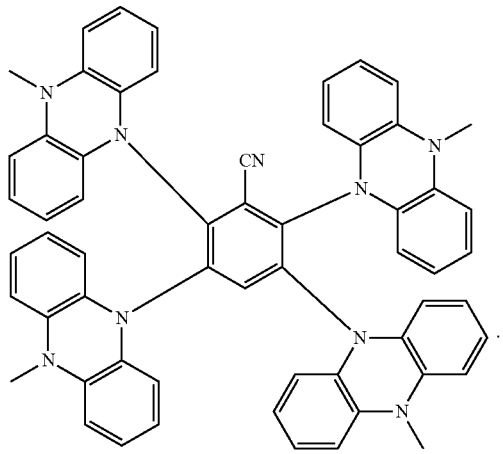

As transformable embodiments of the present disclosure, the structure of the organic electroluminescent device is not limited thereto. Any organic electroluminescent devices within the scope of the appended claims may achieve the object of the present disclosure and fall within the protection scope of the present disclosure. Reference is made to the prior art for the preparation process, and details are not described in the specification.

Comparative Embodiment 1

This comparative embodiment provides an organic electroluminescent device having the same structure as in Embodiment 1, except that the first host material which forms an exciplex with the hole transport layer is removed from the light-emitting layer, and the TADF sensitizer is separately used as the first host material.

Specifically, the structure of the organic electroluminescent device is: ITO/TAPC (30 nm)/TCTA (10 nm)/light-emitting layer (30 nm)/BPBiPA (30 nm)/LiF (1 nm)/Al (150 nm).

The light-emitting layer includes a first host material PhCzTRz and a fluorescent dye PhtBuPAD.

Test Example

Figure 4:
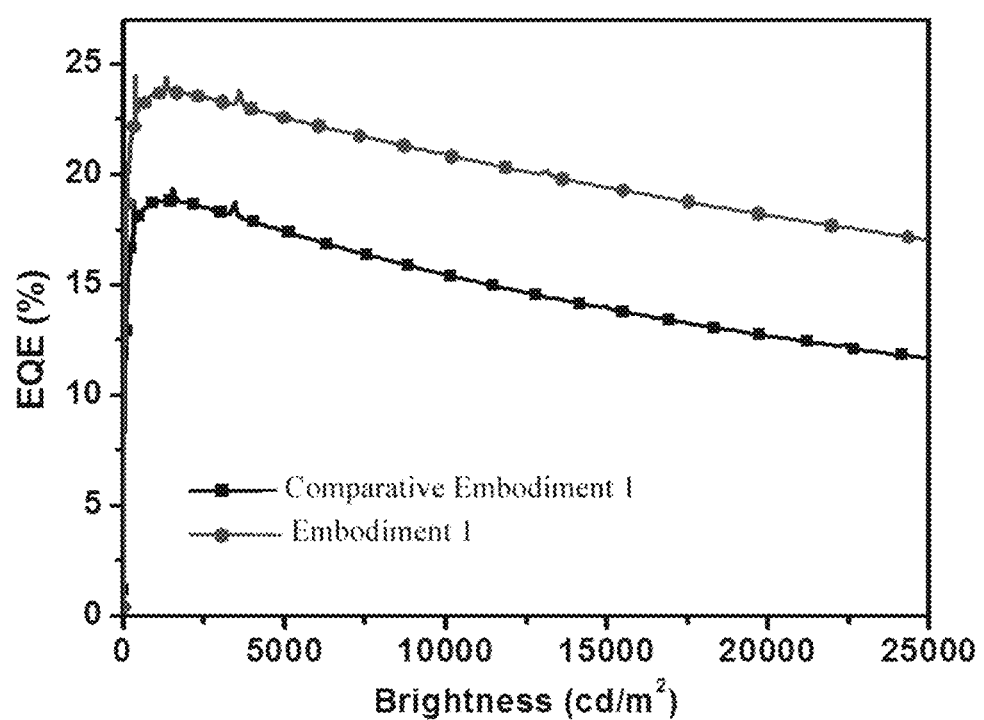
FIG. 4 is a test spectrum of an organic electroluminescent device of Embodiment 1 and Comparative Embodiment 1 of the present disclosure.

The characteristics of current, voltage, brightness, and luminescence spectrum, of the device are synchronously tested by a PR 650 spectral scanning brightness meter and a Keithley K 2400 digital source meter system. The organic electroluminescent devices provided in Embodiments 1-4 and Comparative Embodiment 1 are tested. As shown in FIG. 4, the external quantum efficiency of the device provided in Embodiment 1 is greater than that of the device of Comparative Embodiment 1.

| | Turn-on voltage | Color coordinate CIE (x, y) | Maximum quantum efficiency (%) |
|---|---|---|---|
| Embodiment 1 | 2.4 | (0.36, 0.58) | 24 |
| Embodiment 2 | 2.5 | (0.36, 0.58) | 23 |
| Embodiment 3 | 2.5 | (0.36, 0.58) | 23 |
| Embodiment 4 | 2.4 | (0.36, 0.58) | 24 |
| Comparative Embodiment 1 | 2.9 | (0.36, 0.58) | 19 |

It is apparent that the foregoing embodiments are merely illustrated for clarity, and are not intended to limit the embodiments. Other variations or modifications of different forms may also be made by a person of ordinary skilled in the art on the basis of the foregoing description. There is no need and no way to exhaust all the embodiments here. Obvious variations or modifications resulting therefrom still fall within the protection scope of the present disclosure.

What is claimed is:

1. An organic electroluminescent device, comprising:
   a hole transport layer, and
   a light-emitting layer, wherein the hole transport layer and the light-emitting layer has an interface exciplex formed at an interface therebetween,
   wherein the light-emitting layer comprises a sensitized material, a first host material, and a fluorescent dye, the sensitized material is a Thermally Activated Delayed Fluorescence material, and a material of the hole transport layer and the first host material of the light-emitting layer form the interface exciplex.

2. The organic electroluminescent device of claim 1, wherein, a triplet level of the interface exciplex is less than a triplet level of the material of the hole transport layer, and the triplet level of the interface exciplex is less than a triplet level of the first host material.

3. The organic electroluminescent device of claim 1, wherein a singlet level of the interface exciplex is greater than a singlet level of the Thermally Activated Delayed Fluorescence material, and a triplet level of the interface exciplex is greater than a triplet level of the Thermally Activated Delayed Fluorescence material.

4. The organic electroluminescent device of claim 1, wherein an energy level gap between a HOMO level of the first host material and a LUMO level of the first host material is greater than 2.5 eV.

5. The organic electroluminescent device of claim 1, wherein a singlet-triplet energy level gap of the TADF material is less than 0.2 eV.

6. The organic electroluminescent device of claim 1, wherein the fluorescent dye accounts for 0.1-20% of a mass of the first host material, and the Thermally Activated Delayed Fluorescence material accounts for 5-80% of the mass of the first host material.

7. The organic electroluminescent device of claim 6, wherein the fluorescent dye accounts for 0.5-10% of the mass of the first host material, and the Thermally Activated Delayed Fluorescence material accounts for 10-40% of the mass of the first host material.

8. The organic electroluminescent device of claim 1, wherein the material of the hole transport layer is a compound having a tertiary aromatic amine or carbazole unit.

9. The organic electroluminescent device of claim 8, wherein the material of the hole transport layer employs one of the following structures:

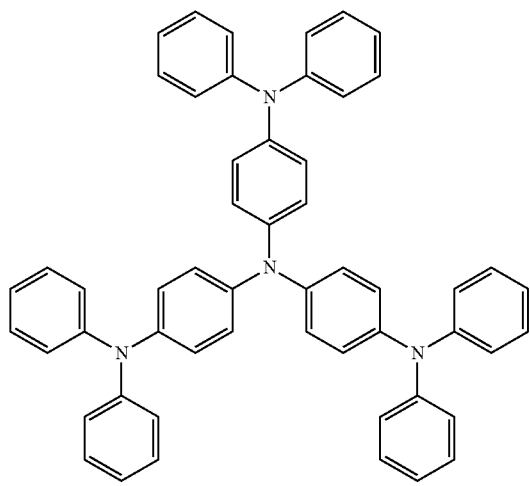

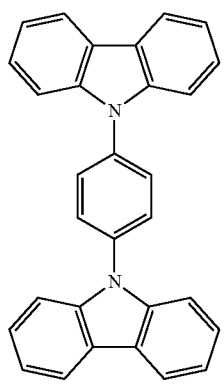

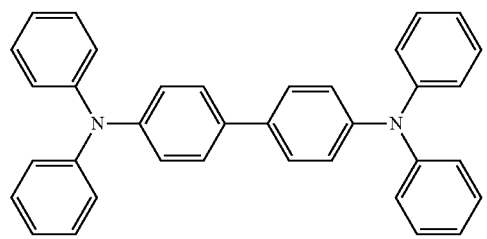

-continued

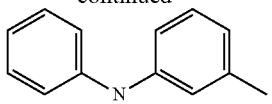

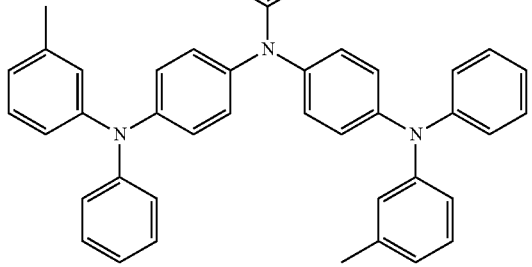

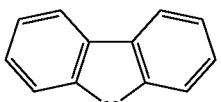

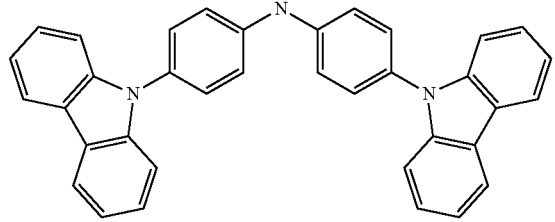

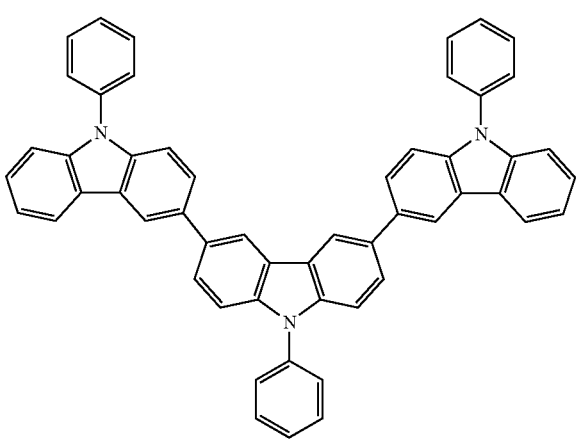

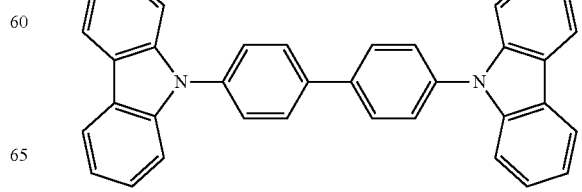

-continued
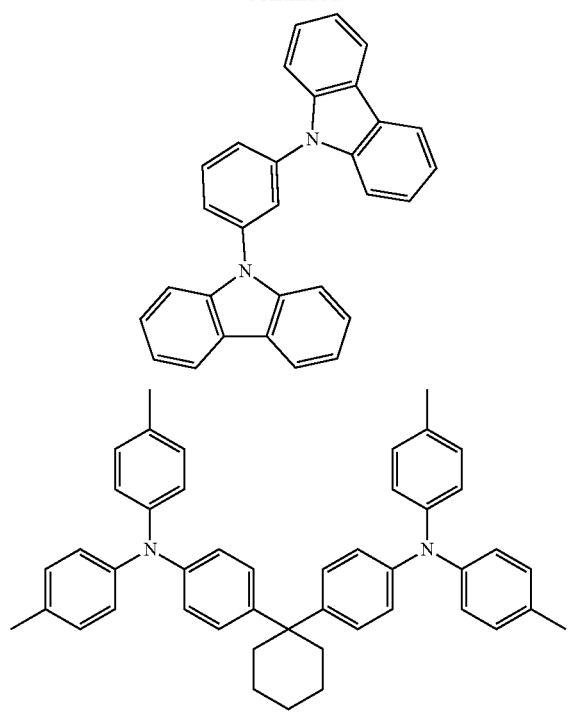
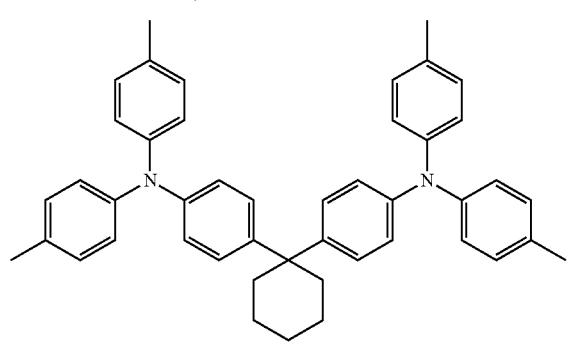
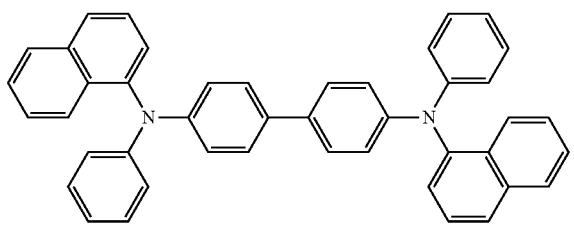
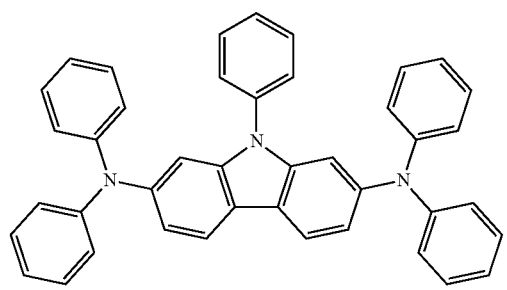
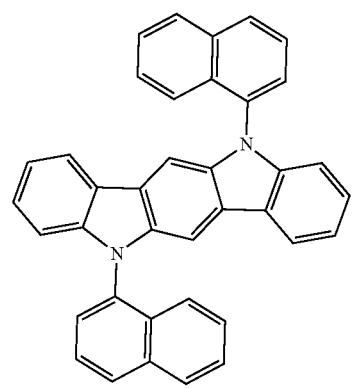
-continued
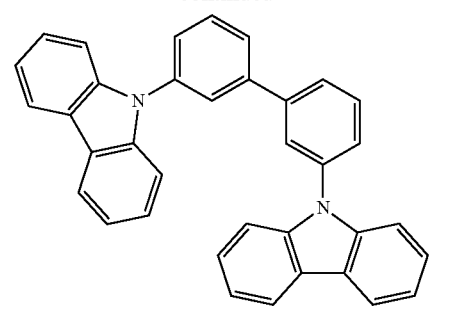
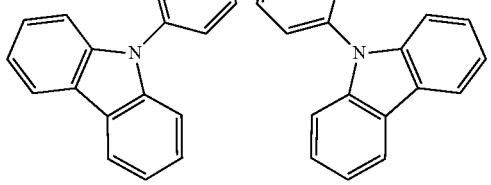
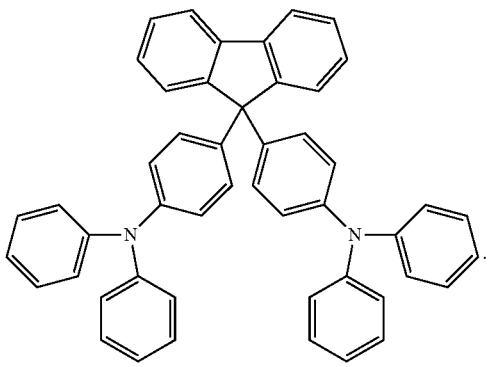
10. The organic electroluminescent device of claim 1, wherein the first host material contains one or more units of carbonyl, phosphine oxide, pyrimidine, or pyridine.
11. The organic electroluminescent device of claim 10, wherein the first host material employs one of the following structures:
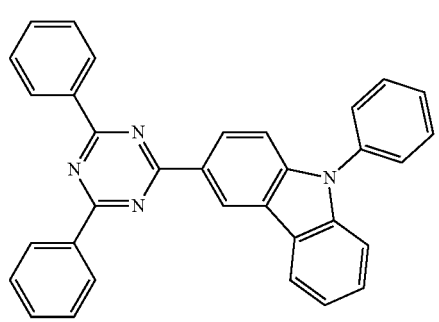

75
-continued
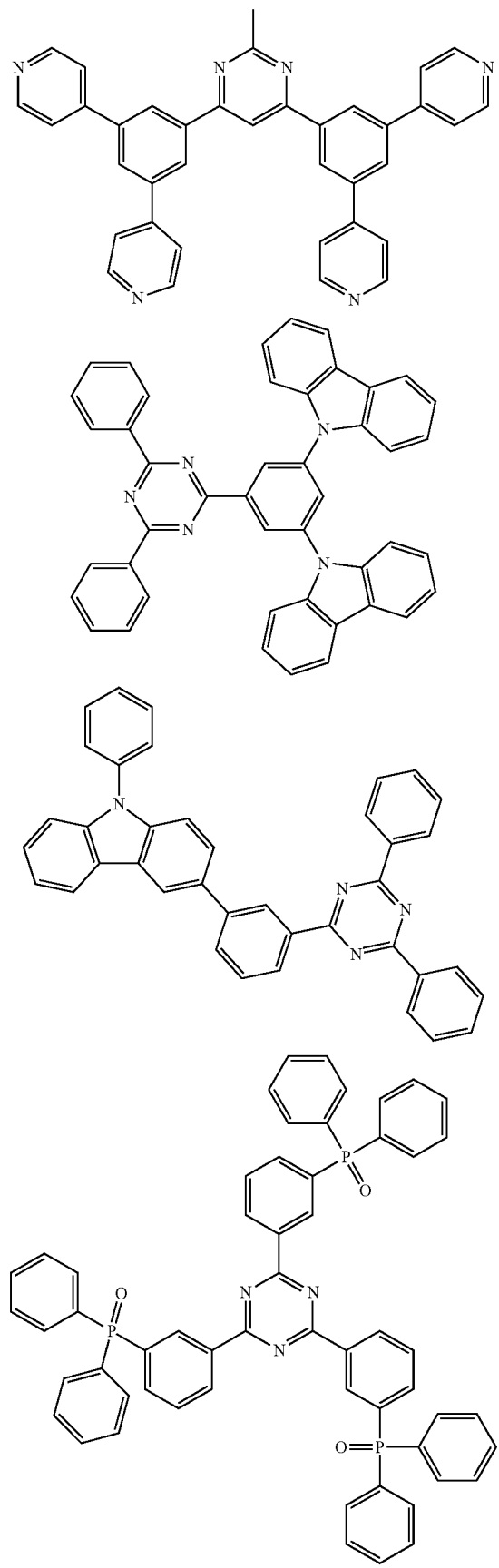
76
-continued
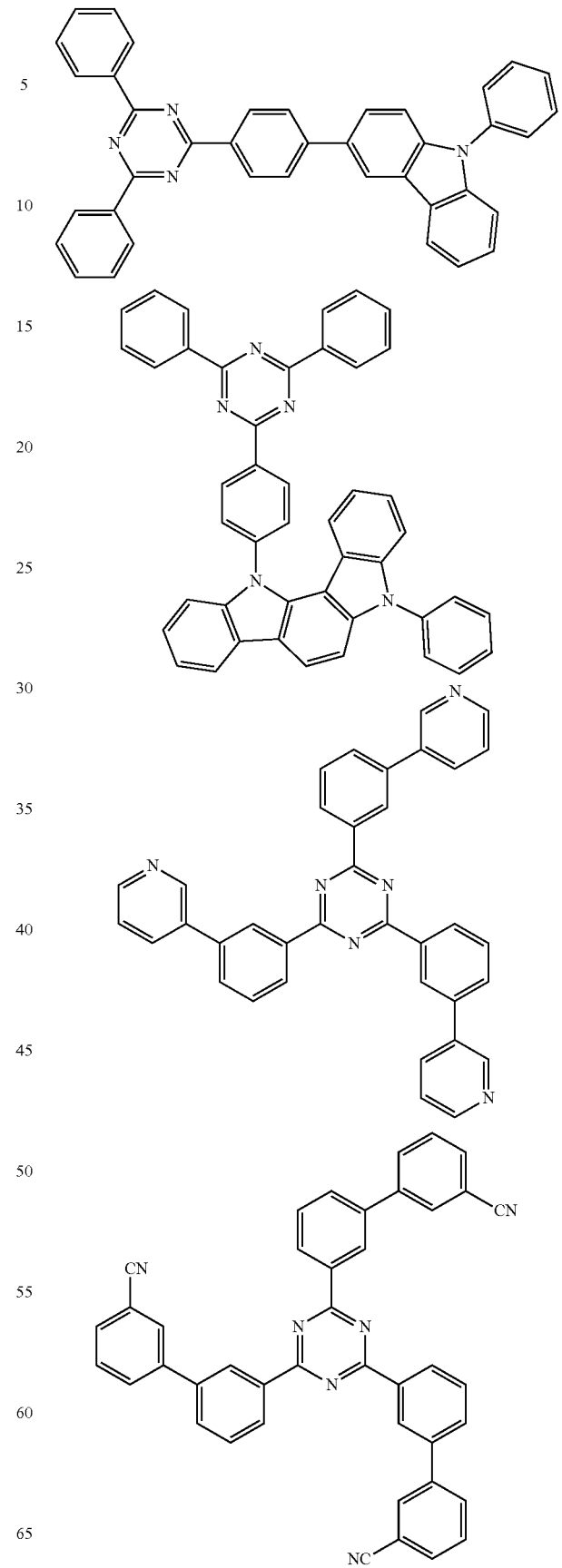

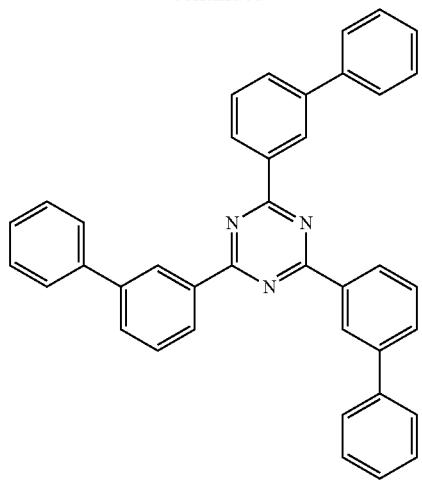

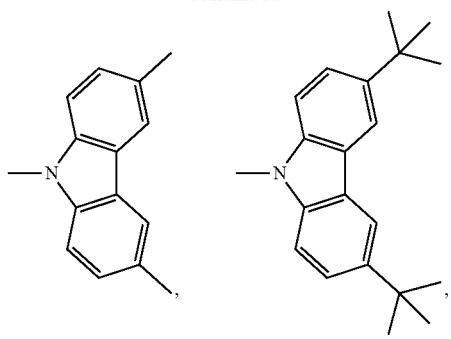

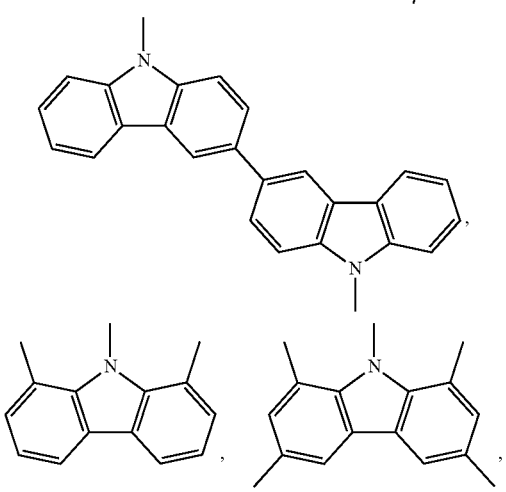

12. The organic electroluminescent device of claim 1, wherein the Thermally Activated Delayed Fluorescence material has a donor unit and a receptor unit;
   wherein the donor unit is formed by linking one or more donor groups; and
   the receptor unit is formed by linking one or more receptor groups.

13. The organic electroluminescent device of claim 12, wherein the donor group is selected from the following groups:

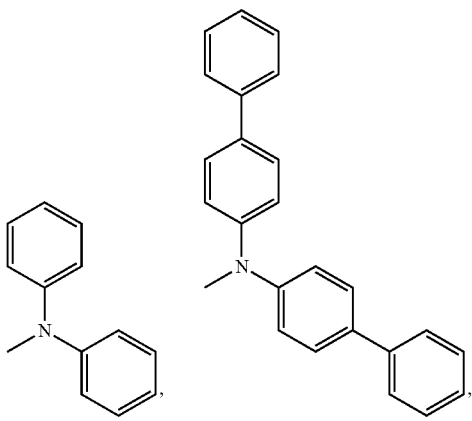

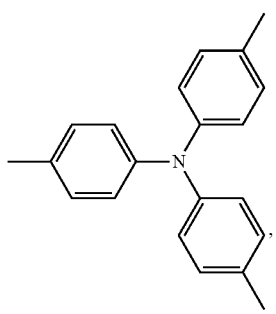

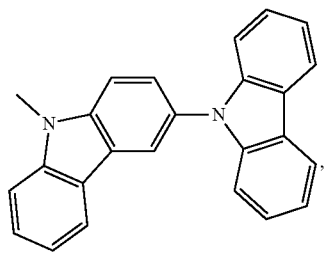
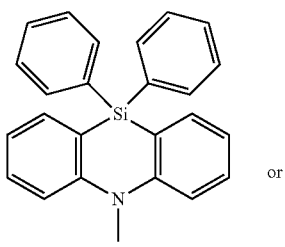
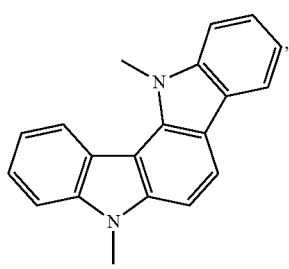
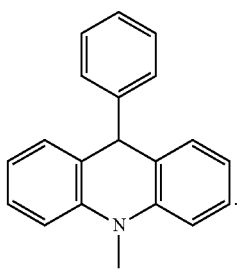
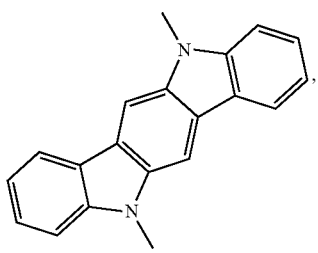
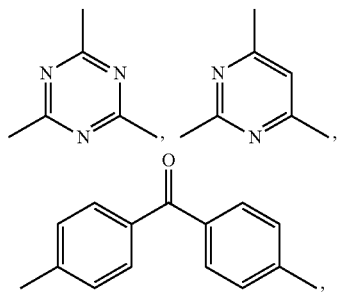
14. The organic electroluminescent device of claim 12, wherein the receptor group is selected from the following groups:
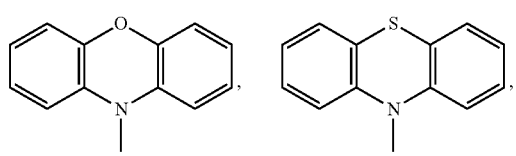
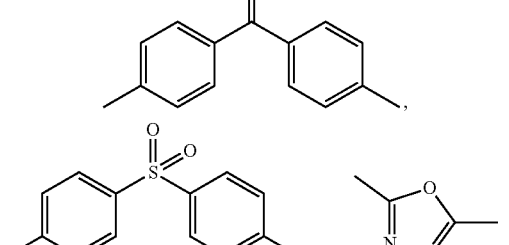
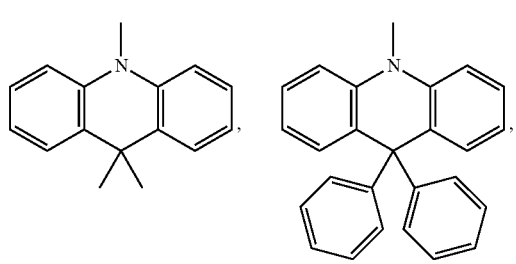
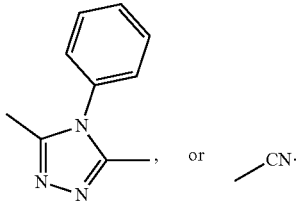
15. The organic electroluminescent device of claim 1, wherein the Thermally Activated Delayed Fluorescence material employs one of the following structures:

81 82
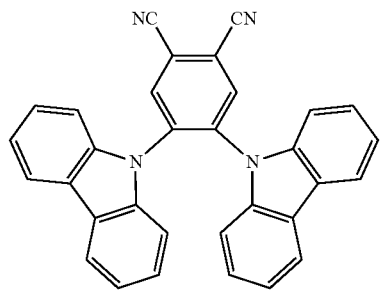
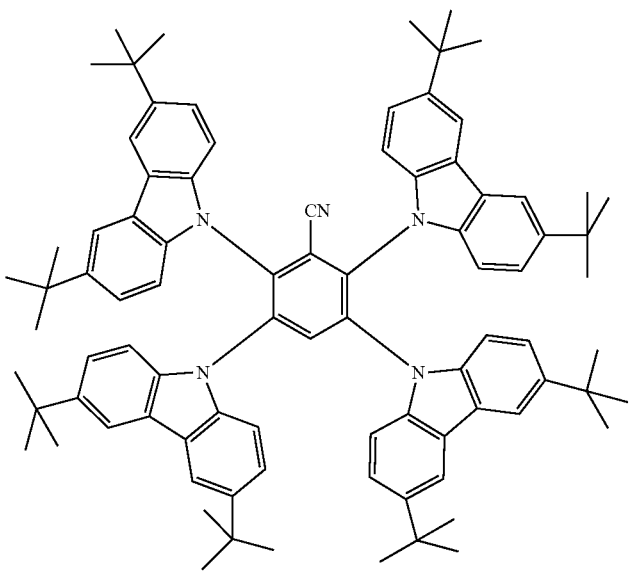
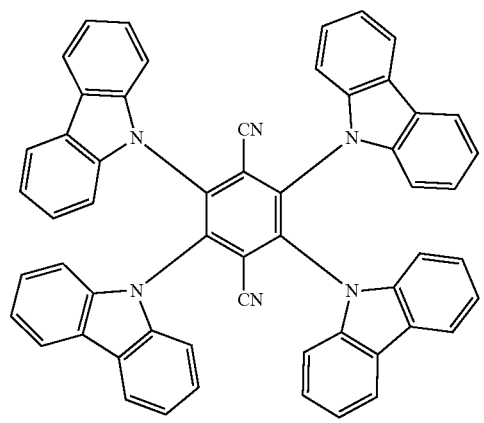
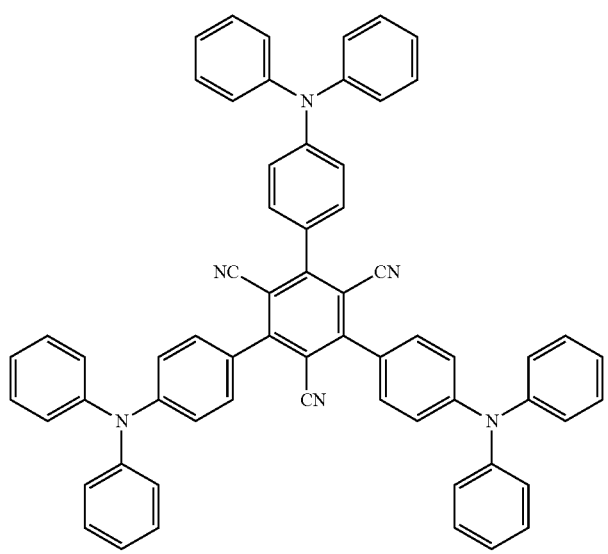
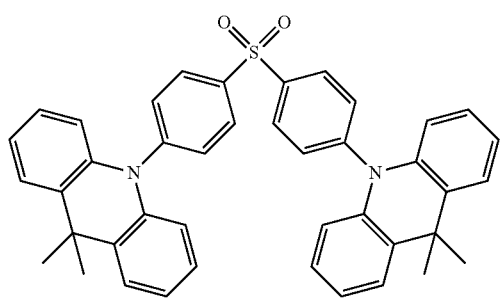
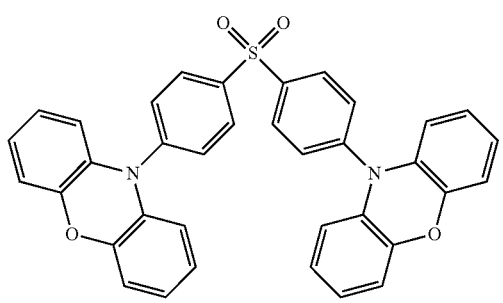

-continued
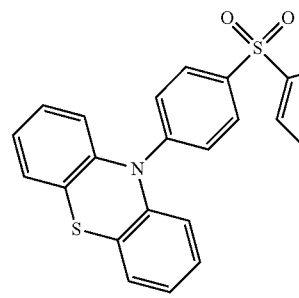
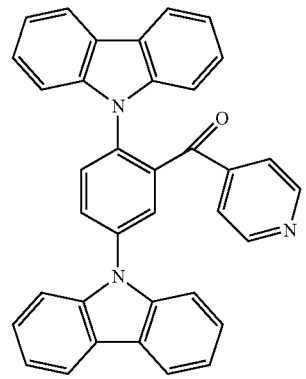
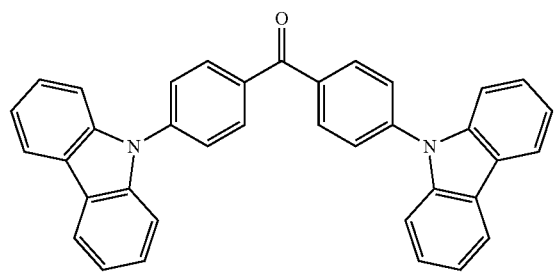
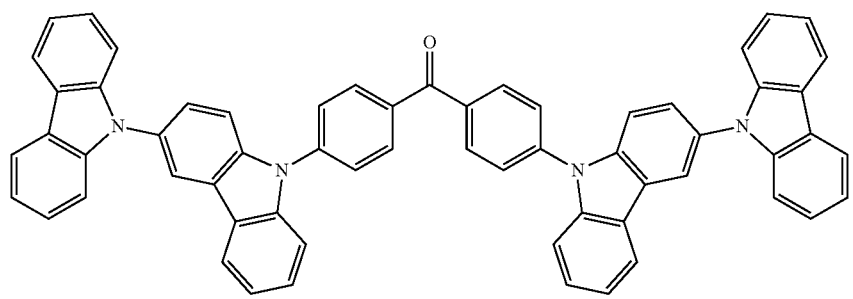
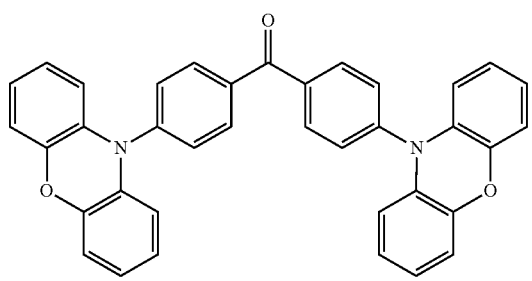
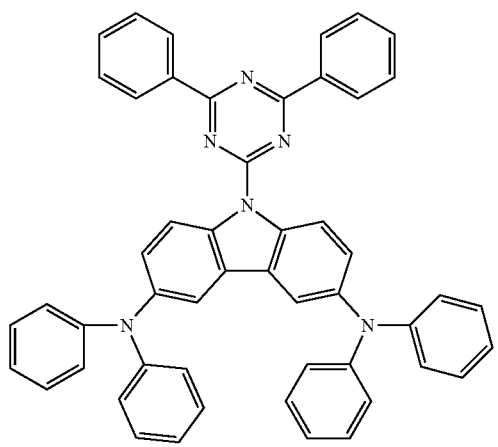

85
86
-continued
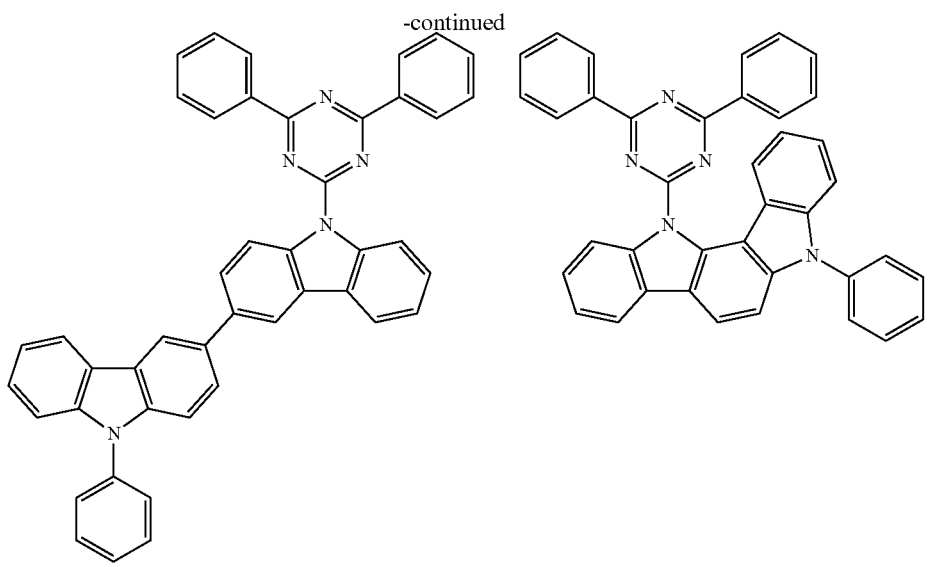
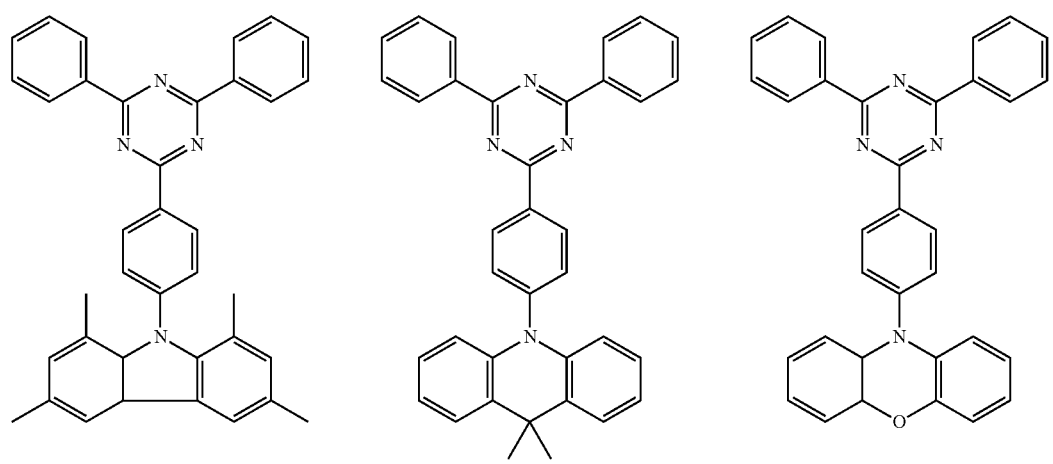
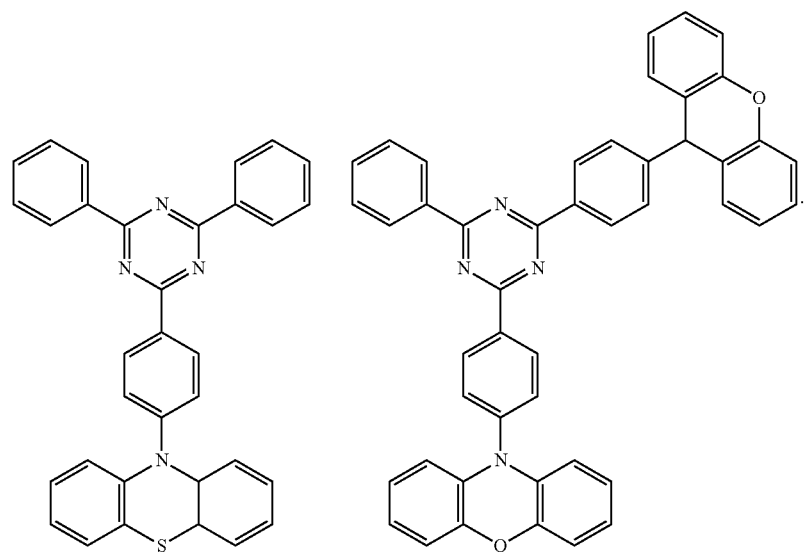

16. The organic electroluminescent device of claim 1, wherein the fluorescent dye employs one of the following structures:
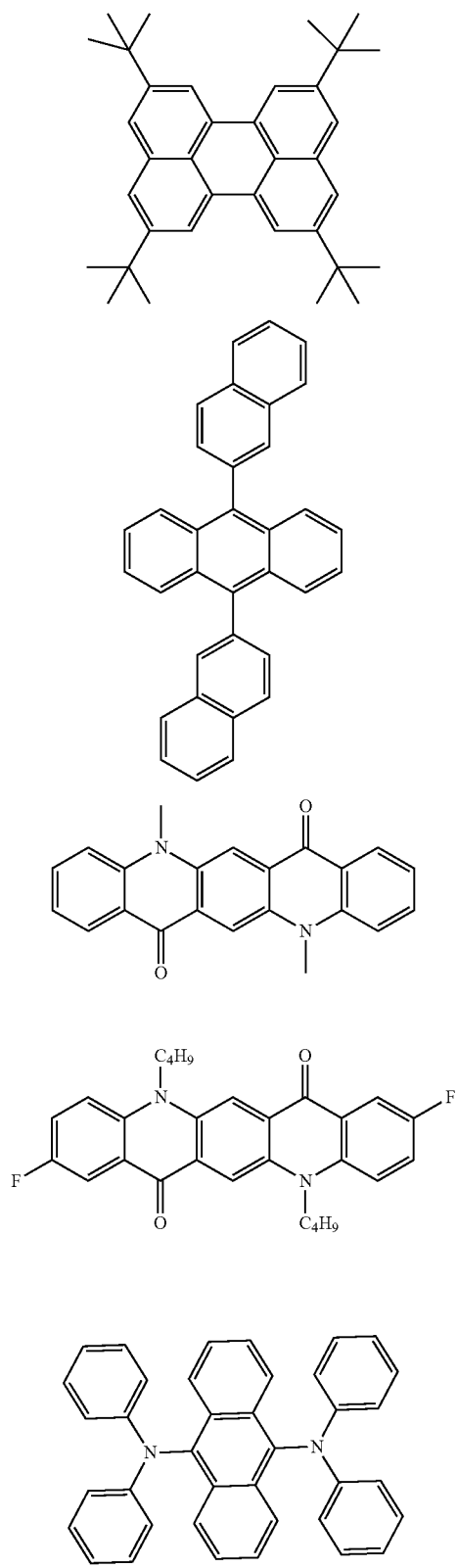
-continued
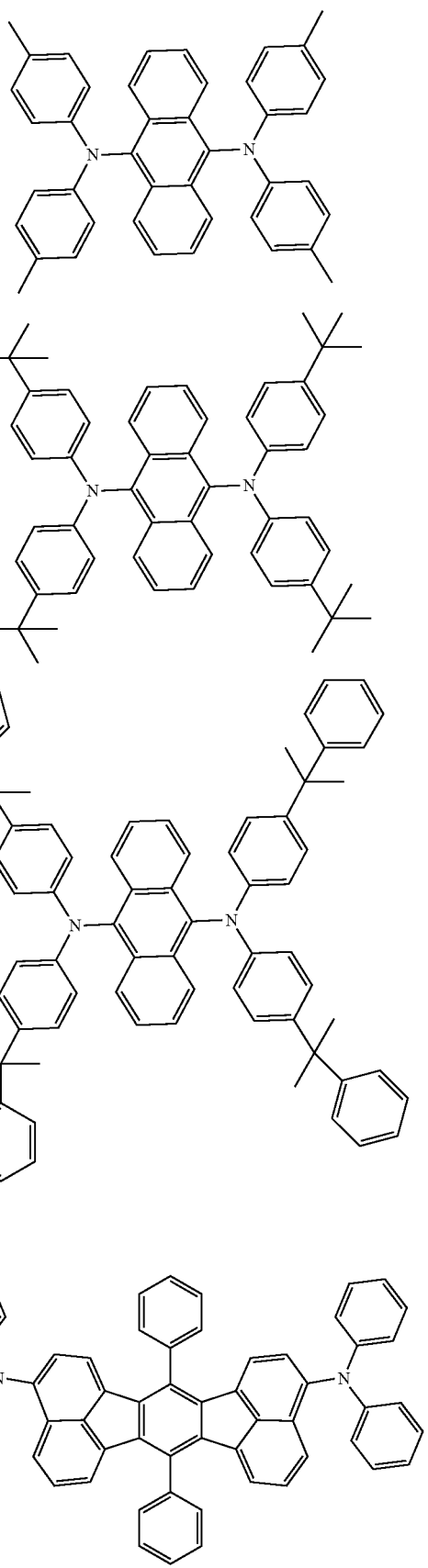

89
-continued
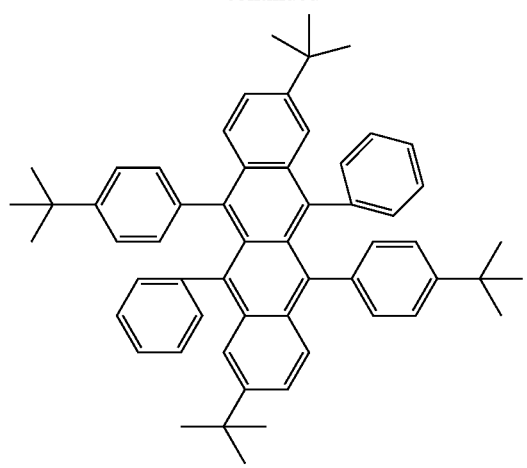
90
-continued
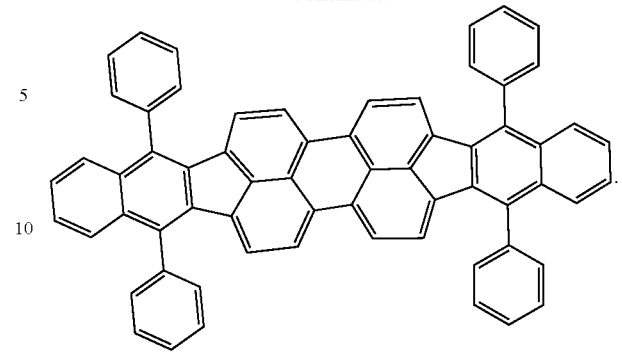
* * * * *